United States Patent
Yamazaki

(10) Patent No.: US 9,893,196 B2
(45) Date of Patent: Feb. 13, 2018

(54) SEMICONDUCTOR DEVICE COMPRISING OXIDE SEMICONDUCTOR FILM

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/684,852

(22) Filed: Apr. 13, 2015

(65) Prior Publication Data

US 2015/0221776 A1   Aug. 6, 2015

Related U.S. Application Data

(62) Division of application No. 13/426,641, filed on Mar. 22, 2012, now Pat. No. 9,012,905.

(30) Foreign Application Priority Data

Apr. 8, 2011 (JP) .................................. 2011-086456

(51) Int. Cl.
*H01L 29/10* (2006.01)
*H01L 29/12* (2006.01)
*H01L 29/786* (2006.01)

(52) U.S. Cl.
CPC .... *H01L 29/7869* (2013.01); *H01L 29/78603* (2013.01)

(58) Field of Classification Search
CPC ........... H01L 29/7869; H01L 21/67011; H01L 21/67086; H01L 29/458; H01L 29/4908
See application file for complete search history.

(56) References Cited

U.S. PATENT DOCUMENTS 5,200,846 A   4/1993   Hiroki et al.
5,218,464 A   6/1993   Hiroki et al.
(Continued)

FOREIGN PATENT DOCUMENTS

EP   0499979 A   8/1992
EP   0502749 A   9/1992
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Thanh Y Tran
(74) *Attorney, Agent, or Firm* — Eric J. Robinson; Robinson Intellectual Property Law Office, P.C.

(57) ABSTRACT

A transistor including an oxide semiconductor with favorable electric characteristics and a manufacturing method thereof are provided. A semiconductor device includes a transistor. The transistor includes an oxide semiconductor film over a base insulating film, a gate electrode overlapping with the oxide semiconductor film with a gate insulating film interposed therebetween, and a pair of electrodes in contact with the oxide semiconductor film and serving as a source electrode and a drain electrode. The base insulating film includes a first oxide insulating film partly in contact with the oxide semiconductor film and a second oxide insulating film in the periphery of the first oxide insulating film. An end portion of the oxide semiconductor film which crosses the channel width direction of the transistor is located over the second oxide insulating film.

33 Claims, 13 Drawing Sheets

(56) References Cited

U.S. PATENT DOCUMENTS

| | | |
|---|---|---|
| 5,289,030 A | 2/1994 | Yamazaki et al. |
| 5,308,998 A | 5/1994 | Yamazaki et al. |
| 5,468,987 A | 11/1995 | Yamazaki et al. |
| 5,485,019 A | 1/1996 | Yamazaki et al. |
| 5,495,121 A | 2/1996 | Yamazaki et al. |
| 5,521,107 A | 5/1996 | Yamazaki et al. |
| 5,528,032 A | 6/1996 | Uchiyama |
| 5,545,571 A | 8/1996 | Yamazaki et al. |
| 5,650,338 A | 7/1997 | Yamazaki et al. |
| 5,731,856 A | 3/1998 | Kim et al. |
| 5,744,864 A | 4/1998 | Cillessen et al. |
| 5,821,559 A | 10/1998 | Yamazaki et al. |
| 5,894,151 A | 4/1999 | Yamazaki et al. |
| 5,899,709 A | 5/1999 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,233,022 B2 | 6/2007 | Park et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,435,667 B2 | 10/2008 | Lin et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,514,747 B2 | 4/2009 | Fukuda |
| 7,598,520 B2 | 10/2009 | Hirao et al. |
| 7,674,650 B2 | 3/2010 | Akimoto et al. |
| 7,732,819 B2 | 6/2010 | Akimoto et al. |
| 7,923,316 B2 | 4/2011 | Park et al. |
| 7,932,521 B2 | 4/2011 | Akimoto et al. |
| 7,993,964 B2 | 8/2011 | Hirao et al. |
| 8,102,034 B2 | 1/2012 | Oikawa et al. |
| 8,164,090 B2 | 4/2012 | Iwasaki et al. |
| 8,242,496 B2 | 8/2012 | Yamazaki et al. |
| 8,284,369 B2 | 10/2012 | Chida et al. |
| 8,445,905 B2 | 5/2013 | Yamazaki et al. |
| 8,502,216 B2 | 8/2013 | Akimoto et al. |
| 8,803,298 B2 | 8/2014 | Oikawa et al. |
| 8,912,541 B2 | 12/2014 | Yamazaki et al. |
| 8,927,329 B2 * | 1/2015 | Imoto et al. ............... 438/104 |
| 9,012,905 B2 * | 4/2015 | Yamazaki ................ 257/43 |
| 9,082,857 B2 | 7/2015 | Yamazaki et al. |
| 9,397,194 B2 | 7/2016 | Yamazaki et al. |
| 2001/0010391 A1 | 8/2001 | Nakajima et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0156239 A1 | 7/2005 | Seko et al. |
| 2005/0199959 A1 | 9/2005 | Chiang et al. |
| 2005/0251994 A1 | 11/2005 | Yuasa |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0001387 A1 * | 1/2009 | Kimura ...................... 257/79 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0147738 A1 * | 6/2011 | Yamazaki ......... H01L 21/02554 257/43 |
| 2012/0061663 A1 * | 3/2012 | Yamazaki ......... H01L 21/02488 257/43 |
| 2012/0223304 A1 | 9/2012 | Yoneda |
| 2012/0225520 A1 * | 9/2012 | Suzawa ............... H01L 29/4908 438/104 |
| 2012/0256177 A1 * | 10/2012 | Yamazaki ..................... 257/43 |
| 2013/0299824 A1 | 11/2013 | Akimoto et al. |
| 2014/0087517 A1 | 3/2014 | Akimoto et al. |
| 2016/0268437 A1 | 9/2016 | Yamazaki et al. |

FOREIGN PATENT DOCUMENTS

| | | |
|---|---|---|
| EP | 1737044 A | 12/2006 |
| EP | 2159845 A | 3/2010 |
| EP | 2175493 A | 4/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 05-251705 A | 9/1993 |
| JP | 06-275697 A | 9/1994 |
| JP | 06-291316 A | 10/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-080241 A | 3/2004 |
| JP | 2004-103957 A | 4/2004 |
| JP | 2004-273614 A | 9/2004 |
| JP | 2004-273732 A | 9/2004 |
| JP | 2005-123563 A | 5/2005 |
| JP | 2005-142567 A | 6/2005 |
| JP | 2007-096055 A | 4/2007 |
| JP | 2007-123861 A | 5/2007 |
| JP | 2008-021874 A | 1/2008 |
| JP | 2008-112909 A | 5/2008 |
| JP | 2009-528670 | 8/2009 |
| JP | 2009-224479 A | 10/2009 |
| JP | 2009-295997 A | 12/2009 |
| JP | 2010-073683 A | 4/2010 |
| JP | 2010-080952 A | 4/2010 |
| JP | 2010-087303 A | 4/2010 |
| JP | 2010-093070 A | 4/2010 |
| JP | 2010-135770 A | 6/2010 |
| JP | 2010-212436 A | 9/2010 |
| JP | 2011-009415 A | 1/2011 |
| JP | 2011-040726 A | 2/2011 |
| JP | 2011-054946 A | 3/2011 |
| TW | 201027710 | 7/2010 |
| WO | WO-2004/114391 | 12/2004 |
| WO | WO-2007/142167 | 12/2007 |
| WO | WO-2010/035627 | 4/2010 |
| WO | WO-2010/053060 | 5/2010 |
| WO | WO-2011/007677 | 1/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga-—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-

(56) References Cited

OTHER PUBLICATIONS crystalline InGaO3(ZnO)5 films", Appl. Phys. Lett. (Applied Physics Letters), Sep. 13, 2004, vol. 85, No. 11, pp. 1993-1995.
Taiwanese Office Action (Application No. 101111431) dated Dec. 28, 2015.
Taiwanese Office Action (Application No. 105115327) dated Feb. 16, 2017.

* cited by examiner

SEMICONDUCTOR DEVICE COMPRISING OXIDE SEMICONDUCTOR FILM

BACKGROUND OF THE INVENTION

1. Field of the Invention

The present invention relates to a semiconductor device which includes a circuit including a semiconductor element such as a transistor, and a method for manufacturing the semiconductor device. For example, the present invention relates to a power device which is mounted on a power supply circuit; a semiconductor integrated circuit including a memory, a thyristor, a converter, an image sensor, or the like; an electro-optical device typified by a liquid crystal display panel; a light-emitting display device including a light-emitting element; and an electronic device on which any of the above is mounted as a component.

In this specification, a semiconductor device means all types of devices which can function by utilizing semiconductor characteristics, and an electro-optical device, a light-emitting display device, a semiconductor circuit, and an electronic device are all semiconductor devices.

2. Description of the Related Art

Transistors formed over a glass substrate or the like are typically formed using amorphous silicon, polycrystalline silicon, or the like, as typically seen in liquid crystal display devices. Although transistors formed using amorphous silicon have low field-effect mobility, they can be formed over a larger glass substrate. On the other hand, although transistors formed using polycrystalline silicon have high field-effect mobility, they are not suitable for being formed over a larger glass substrate.

In view of the foregoing, attention has been drawn to a technique by which a transistor is manufactured using an oxide semiconductor, and such a transistor is applied to an electronic device or an optical device. For example, Patent Document 1 and Patent Document 2 disclose a technique by which a transistor is manufactured using zinc oxide or an In—Ga—Zn—O-based oxide as an oxide semiconductor, and such a transistor is used as a switching element of a pixel or the like of a display device.

It has been pointed out that hydrogen is a supply source of carriers particularly in an oxide semiconductor. Therefore, some measures need to be taken to prevent hydrogen from entering the oxide semiconductor at the time of depositing the oxide semiconductor. Variation in threshold voltage is suppressed by reducing hydrogen contained in not only the oxide semiconductor but also a gate insulating film in contact with the oxide semiconductor (see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2009-224479

However, in a region where an oxygen vacancy is formed in an oxide semiconductor of a transistor, the oxygen vacancy serves as a supply source of a carrier, so that carriers tend to flow and the electric characteristics of the transistor are adversely affected.

SUMMARY OF THE INVENTION

In view of the above, it is an object of an embodiment of the present invention to provide a transistor including an oxide semiconductor with favorable electric characteristics and a manufacturing method thereof.

An embodiment of the present invention is a semiconductor device including a transistor. The transistor includes an oxide semiconductor film over a base insulating film, a gate electrode overlapping with the oxide semiconductor film with a gate insulating film interposed therebetween, and a pair of electrodes in contact with the oxide semiconductor film and serving as a source electrode and a drain electrode. The base insulating film includes a first oxide insulating film partly in contact with the oxide semiconductor film and a second oxide insulating film in the periphery of the first oxide insulating film. An end portion of the oxide semiconductor film which crosses the channel width direction of the transistor is located over the second oxide insulating film. That is, at a surface in contact with the oxide semiconductor film, a boundary between the first oxide insulating film and the second oxide insulating film is located on the inner side than the side surface of the oxide semiconductor film.

Note that the oxide semiconductor film may include a first region overlapping with the gate electrode and a pair of second regions containing dopant between which the first region is sandwiched. The first region serves as a channel region, part of the pair of second regions serve as regions for relieving an electric field, and the other part of the pair of second regions serve as a source region and a drain region.

An embodiment of the present invention is a method for manufacturing a semiconductor device in which a transistor is formed through the following steps: forming a first oxide insulating film and a second oxide insulating film in the periphery of the first oxide insulating film, forming a first oxide semiconductor film over the first oxide insulating film and the second oxide insulating film such that at least part of an end portion of the first oxide semiconductor film is located over the second oxide insulating film, forming an insulating film over the first oxide insulating film, the second oxide insulating film, and the first oxide semiconductor film and performing heat treatment, thereby forming a second oxide semiconductor film, forming a gate electrode over the insulating film and etching part of the insulating film, thereby exposing part of the second oxide semiconductor film and forming a gate insulating film, and forming a pair of electrodes in contact with exposed part of the second oxide semiconductor film. Note that the first oxide semiconductor film is formed such that the end portion of the first oxide semiconductor film which crosses the channel width direction of the transistor is located over the second oxide insulating film. That is, the first oxide semiconductor film is formed such that, at a surface in contact with the oxide semiconductor film, a boundary between the first oxide insulating film and the second oxide insulating film is located on the inner side than the end portion of the first oxide semiconductor film.

The first oxide insulating film is formed using an oxide insulating film from which part of oxygen is released by heating. The second oxide insulating film is formed using an oxide insulating film preventing diffusion of oxygen to the outside. The end portion of the first oxide semiconductor film which crosses the channel length direction of the transistor may be located over the first oxide insulating film. Alternatively, the end portion of the first oxide semiconductor film which crosses the channel length direction of the transistor may be located over the second oxide insulating film.

The oxide semiconductor film, the first oxide semiconductor film, and the second oxide semiconductor film each contain at least one kind of element selected from In, Ga, Sn, and Zn.

When the heat treatment is performed after the insulating film is formed over the first oxide semiconductor film, oxygen released from the insulating film can be diffused to a side surface of the first oxide semiconductor film which crosses the channel width direction of the transistor. On the side in contact with the first oxide semiconductor film, the first oxide insulating film is surrounded by the second oxide insulating film which is formed using an oxide insulating film that prevents diffusion of oxygen to the outside. Therefore, oxygen released from the first oxide insulating film by heating can be diffused to the first oxide semiconductor film and the vicinity of the interface between the first oxide insulating film and the first oxide semiconductor film efficiently.

Further, since the end portion of the first oxide semiconductor film is located over the second oxide insulating film, the first oxide insulating film on the side in contact with the first oxide semiconductor film, except a region in contact with the second oxide insulating film, is all in contact with the first oxide semiconductor film. That is, the first oxide semiconductor film also serves as a film preventing diffusion of oxygen from the first oxide insulating film to the outside, and thus, release of excess oxygen from the first oxide insulating film is not caused and oxygen remains in the first oxide insulating film. Therefore, oxygen released from the first oxide insulating film by heating can be preferentially and efficiently diffused to the first oxide semiconductor film. As a result, the second oxide semiconductor film in which oxygen vacancies are reduced can be formed.

In addition, it is preferable that the end portions of the oxide semiconductor film which cross the channel width direction of the transistor and in which oxygen vacancies are reduced be located on the outer side than the end portions of the pair of electrodes. In particular, it is preferable that the end portions of the oxide semiconductor film which cross the channel width direction be located on the outer side than the end portions of the pair of electrodes which cross the channel width direction so that an influence of an electric field from the pair of electrodes can be as small as possible. In this way, formation of a parasitic channel in a region outside the pair of electrodes of the oxide semiconductor film in the channel width direction can be reduced.

In accordance with an embodiment of the present invention, oxygen vacancies in an oxide semiconductor film can be reduced. As a result, a negative shift of the threshold voltage of a transistor can be reduced, and in addition, the electric characteristics of the transistor can be improved.

DETAILED DESCRIPTION OF THE INVENTION

Figure 1A:
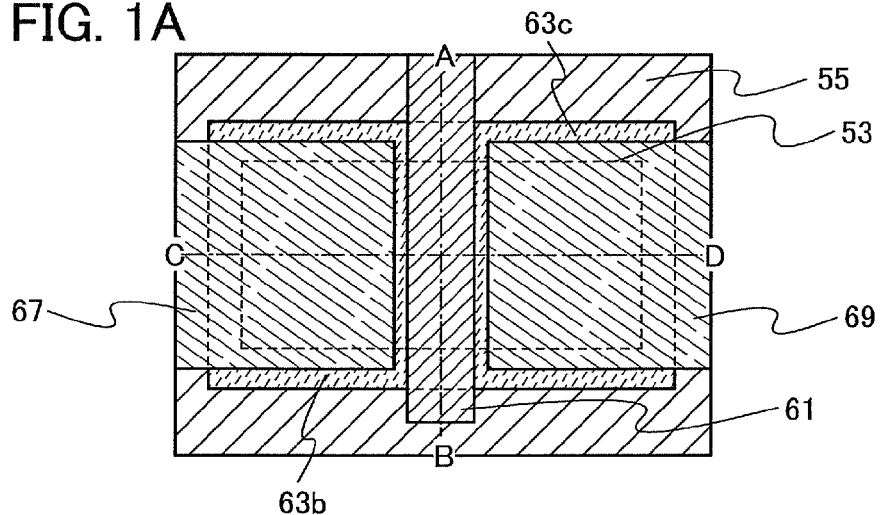
FIGS. 1A to 1C are a top view and cross-sectional views each illustrating a semiconductor device according to an embodiment of the present invention.

Embodiments of the present invention will be described in detail with reference to the accompanying drawings. Note that the present invention is not limited to the description below, and it is easily understood by those skilled in the art that modes and details thereof can be variously changed without departing from the spirit and the scope of the present invention. Therefore, the present invention should not be construed as being limited to the description in the following embodiments. Note that the same portions or portions having similar functions in the structure of the present invention described below are denoted by the same reference numerals throughout the drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

(Embodiment 1)

In this embodiment, a structure of a transistor in which a leakage current can be reduced and a manufacturing method of the transistor will be described with reference to FIGS. 1A to 1C, FIGS. 2A and 2B, FIGS. 3A to 3J, FIGS. 4A to 4H, and FIGS. 5A to 5F.

Figure 1B:
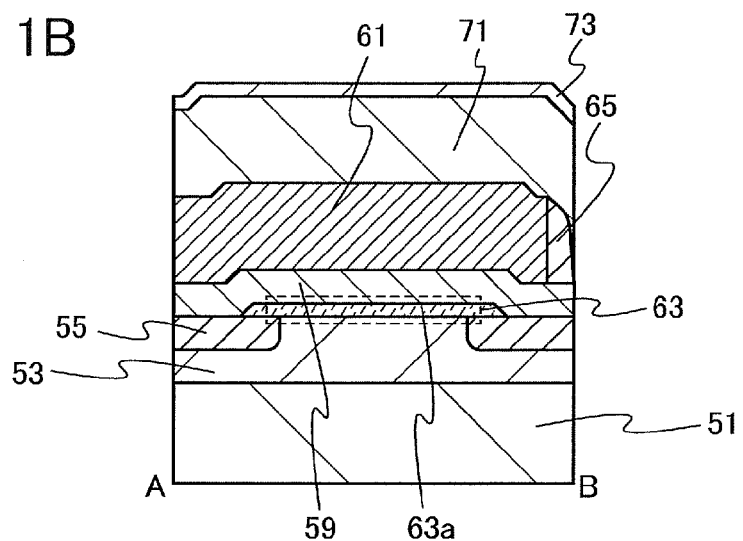
Figure 1C:
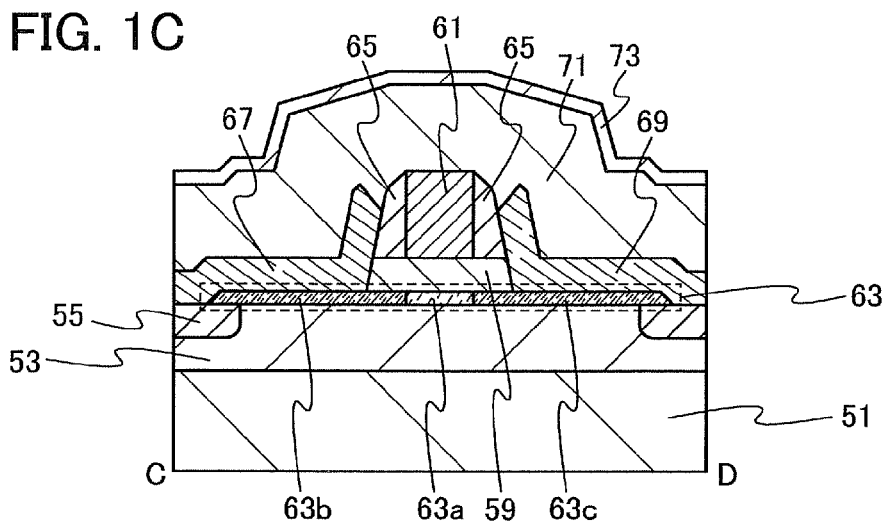

FIGS. 1A to 1C are a top view and cross-sectional views of a transistor described in this embodiment. FIG. 1A is a top view of the transistor described in this embodiment, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, illustration of some components of the transistor (e.g., a gate insulating film 59, sidewall insulating films 65, an insulating film 71, an insulating film 73, and the like) is omitted for simplicity.

The transistor illustrated in FIGS. 1A to 1C includes a first oxide insulating film 53 over a substrate 51, a second oxide insulating film 55 in the periphery of the first oxide insulating film 53, an oxide semiconductor film 63 over the first oxide insulating film 53 and the second oxide insulating film 55, a pair of electrodes 67 and 69 in contact with the oxide semiconductor film 63 and serving as a source electrode and a drain electrode, the gate insulating film 59 in contact with at least part of the oxide semiconductor film 63, and a gate electrode 61 over the gate insulating film 59 and overlapping with the oxide semiconductor film 63. The sidewall insulating films 65 in contact with side surfaces of the gate electrode 61 may be provided. The oxide semiconductor film 63 includes a first region 63a overlapping with the gate electrode 61 and a pair of second regions 63b and 63c containing dopant between which the first region 63a is sandwiched. In the oxide semiconductor film 63, the first region 63a serves as a channel region, regions in the pair of second regions 63b and 63c containing dopant which overlap with the sidewall insulating films 65 serve as regions for relieving an electric field, and regions in the pair of second regions 63b and 63c containing dopant which overlap with the pair of electrodes 67 and 69 serve as a source region and a drain region. In addition, the insulating film 71 covering the first oxide insulating film 53, the second oxide insulating film 55, the gate electrode 61, the sidewall insulating films 65, and the pair of electrodes 67 and 69 may be provided. Moreover, the insulating film 73 covering the insulating film 71 may be provided.

In this embodiment, the first oxide insulating film 53 and the second oxide insulating film 55 serve as a base insulating film of the oxide semiconductor film 63. In addition, as illustrated in FIG. 1B, an end portion of the oxide semiconductor film 63 which crosses the channel width direction of the transistor is located over the second oxide insulating film 55. That is, at a surface in contact with the oxide semiconductor film, a boundary between the first oxide insulating film and the second oxide insulating film is located on the inner side than the side surface of the oxide semiconductor film 63. Note that the channel width direction of the transistor is parallel to a plane along which the pair of electrodes 67 and 69 face each other. In this specification, an end portion refers to a region including at least a side surface and may include a side surface and part of a surface in contact with the side surface.

In addition, as illustrated in FIG. 1C, an end portion of the oxide semiconductor film 63 which crosses the channel length direction of the transistor is located over the second oxide insulating film 55. That is, at the surface in contact with the oxide semiconductor film 63, the boundary between the first oxide insulating film 53 and the second oxide insulating film 55 is located on the inner side than the side surface of the oxide semiconductor film 63. Note that the channel length direction of the transistor is perpendicular to the plane along which the pair of electrodes 67 and 69 face each other.

There is no particular limitation on a material and the like of the substrate 51 as long as the material has heat resistance high enough to withstand at least heat treatment performed later. For example, a glass substrate, a ceramic substrate, a quartz substrate, a sapphire substrate, or the like may be used as the substrate 51. Alternatively, a single crystal semiconductor substrate or a polycrystalline semiconductor substrate made of silicon, silicon carbide, or the like; a compound semiconductor substrate made of silicon germanium or the like; an SOI substrate; or the like can be used as the substrate 51. Still alternatively, any of these substrates provided with a semiconductor element may be used as the substrate 51.

Further, a flexible substrate may be used as the substrate 51. A separation layer may be provided between the substrate 51 and the first oxide insulating film 53. The separation layer can be used when part or the whole of a semiconductor device formed over the separation layer is completed and separated from the substrate 51 and transferred to another substrate. In such a case, the semiconductor device can be transferred to a substrate having low heat resistance or a flexible substrate as well.

The first oxide insulating film 53 is formed using an oxide insulating film from which part of oxygen is released by heating. The oxide insulating film from which part of oxygen is released by heating is preferably an oxide insulating film which contains oxygen at a proportion exceeding the stoichiometric proportion. The oxide insulating film from which part of oxygen is released by heating can diffuse oxygen to the oxide semiconductor film by heating. Typical examples of the first oxide insulating film 53 include films of silicon oxide, silicon oxynitride, silicon nitride oxide, gallium oxide, hafnium oxide, yttrium oxide, and the like.

The thickness of the first oxide insulating film 53 is greater than or equal to 50 nm, preferably greater than or equal to 200 nm and less than or equal to 500 nm. With the use of the thick first oxide insulating film 53, the amount of oxygen released from the first oxide insulating film 53 can be increased, and in addition, interface states at the interface between the first oxide insulating film 53 and the oxide semiconductor film to be formed later can be reduced.

Here, "to release part of oxygen by heating" means that the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

Here, a measurement method of the amount of released oxygen converted into oxygen atoms in TDS analysis is described as below.

The desorption amount of a gas in the TDS analysis is proportional to an integral value of a spectrum. Therefore, the amount of a desorbed gas can be calculated from the ratio between the integral value of a spectrum of an insulating film and the reference value of a standard sample. The reference value of a standard sample refers to the ratio of the density of a predetermined atom contained in the sample to the integral value of a spectrum.

For example, the amount of released oxygen molecules ($N_{O2}$) from an insulating film can be calculated according to Formula 1 using the TDS analysis results of a silicon wafer containing hydrogen at a predetermined density, which is the standard sample, and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = N_{H2}/S_{H2} \times S_{O2} \alpha \quad \text{(Formula 1)}$$

$N_{H2}$ is the value obtained by converting the amount of hydrogen molecules released from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. α is a coefficient affecting the intensity of the spectrum in the TDS analysis. Refer to Japanese Published Patent Application No. H6-275697 for details of Formula 1. Note that the amount of released oxygen from the above insulating film is measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of oxygen molecules, the amount of the released oxygen atoms can also be estimated through the evaluation of the amount of the released oxygen molecules.

Note that $N_{O2}$ is the amount of released oxygen molecules. In the insulating film, the amount of released oxygen converted into oxygen atoms is twice the amount of the released oxygen molecules.

In the above structure, the insulating film from which oxygen is released by heating may be oxygen-excess silicon oxide ($SiO_X(X>2)$). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry.

The second oxide insulating film 55 is formed using an oxide insulating film which prevents diffusion of oxygen to the outside. By forming the oxide insulating film which prevents diffusion of oxygen to the outside in the periphery of the first oxide insulating film 53, release of oxygen from the first oxide insulating film by heating can be controlled, so that oxygen can be selectively diffused to the oxide semiconductor film 63. As a typical example of the second oxide insulating film 55, aluminum oxide, aluminum oxynitride, or the like can be used. As for aluminum oxide, aluminum oxide containing oxygen at a proportion satisfying the stoichiometric proportion or aluminum oxide containing oxygen at a proportion exceeding the stoichiometric proportion (AlOx, x is greater than or equal to 3/2) is preferably used. In addition, in aluminum oxynitride, part of oxygen in aluminum oxide containing oxygen at a proportion satisfying the stoichiometric proportion is replaced with nitrogen.

By supplying oxygen from the first oxide insulating film 53 to the oxide semiconductor film 63, interface states at the interface between the first oxide insulating film 53 and the oxide semiconductor film 63 can be reduced. As a result, capture of electric charge which may be generated owing to operation of the transistor or the like at the interface between the first oxide insulating film 53 and the oxide semiconductor film 63 can be suppressed. It is possible to provide a transistor in which a negative shift of the threshold voltage can be reduced and deterioration in electric characteristics is suppressed.

Electric charge is generated owing to an oxygen vacancy in the oxide semiconductor film 63 in some cases. In general, part of oxygen vacancies in the oxide semiconductor film serves as a donor to generate an electron that is a carrier. As a result, the threshold voltage of a transistor shifts in the negative direction. This tendency occurs remarkably in an oxygen vacancy formed on the back channel side. Note that the term "back channel" in this specification refers to the vicinity of an interface of the first region 63a in the oxide semiconductor film 63 with the first oxide insulating film 53 in FIG. 1B. By supplying sufficient oxygen from the first oxide insulating film 53 to the oxide semiconductor film 63, oxygen vacancies in the oxide semiconductor film 63 which causes the shift of the threshold voltage in the negative direction can be compensated.

In other words, when an oxygen vacancy is formed in the oxide semiconductor film 63, electric charge is captured at the interface between the first oxide insulating film 53 and the oxide semiconductor film 63 and the electric charge adversely affects the electric characteristics of the transistor. However, by providing an insulating film from which oxygen is released by heating as the first oxide insulating film 53, interface states at the interface between the oxide semiconductor film 63 and the first oxide insulating film 53 and oxygen vacancies in the oxide semiconductor film 63 can be reduced, and an influence of the capture of the electric charge at the interface between the oxide semiconductor film 63 and the first oxide insulating film 53 can be made small.

The first oxide insulating film 53, on the side in contact with the oxide semiconductor film 63, is surrounded by the second oxide insulating film 55 which is formed using an oxide insulating film that prevents diffusion of oxygen to the outside. Accordingly, oxygen released from the first oxide insulating film 53 by heating can be efficiently diffused to the oxide semiconductor film 63.

Further, since the end portion of the oxide semiconductor film 63 is located over the second oxide insulating film 55, the first oxide insulating film 53 on the side in contact with the oxide semiconductor film 63, except a region in contact with the second oxide insulating film 55, is all in contact with the oxide semiconductor film 63. That is, the oxide semiconductor film 63 also serves as a film preventing diffusion of oxygen from the first oxide insulating film 53 to the outside, and thus, release of excess oxygen from the first oxide insulating film 53 is not caused and oxygen remains in the first oxide insulating film 53. In this way, the oxide semiconductor film 63 is an oxide semiconductor film to which oxygen released from the first oxide insulating film 53 is efficiently diffused, and the oxygen is efficiently diffused to the oxide semiconductor film 63 and the vicinity of the interface between the first oxide insulating film 53 and the oxide semiconductor film 63. That is, the oxide semiconductor film 63 is an oxide semiconductor film in which oxygen vacancies are reduced.

In addition, it is preferable that the end portions of the oxide semiconductor film 63 which cross the channel width direction of the transistor be located on the outer side than the end portions of the pair of electrodes 67 and 69. In particular, it is preferable that the end portions of the oxide semiconductor film be located on the outer side than the end portions of the pair of electrodes 67 and 69 so that an influence of an electric field from the pair of electrodes can be as small as possible. That is, when a region of the oxide semiconductor film 63 which is on the outer side than the pair of electrode 67 and 69 in the channel width direction is as wide as possible, generation of a parasitic channel in the region of the oxide semiconductor film 63 can be reduced, which leads to a reduction in leakage current of the transistor.

Figure 2A:
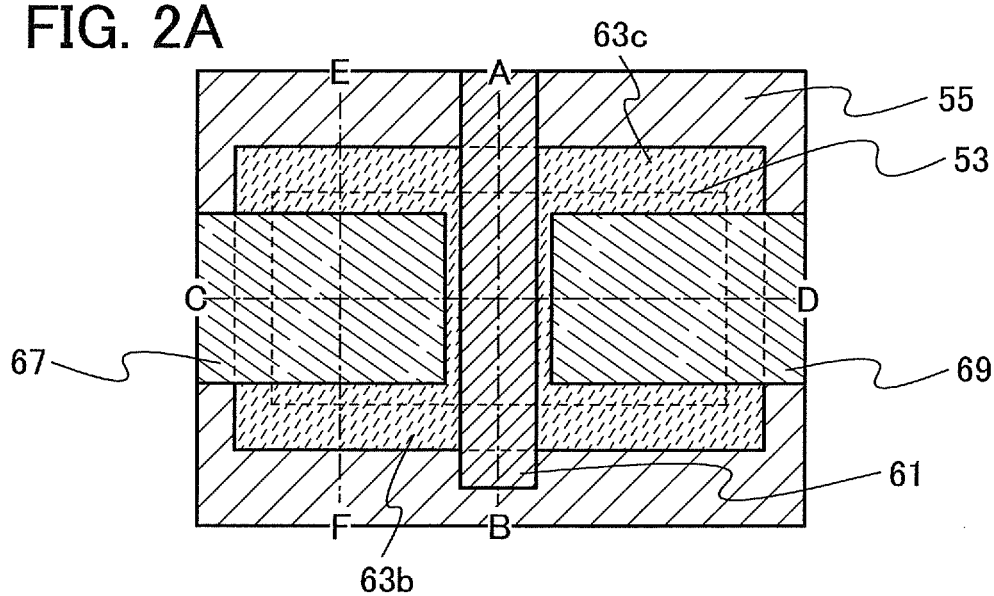
FIGS. 2A and 2B are a top view and a cross-sectional view each illustrating a semiconductor device according to an embodiment of the present invention.
Figure 2B:
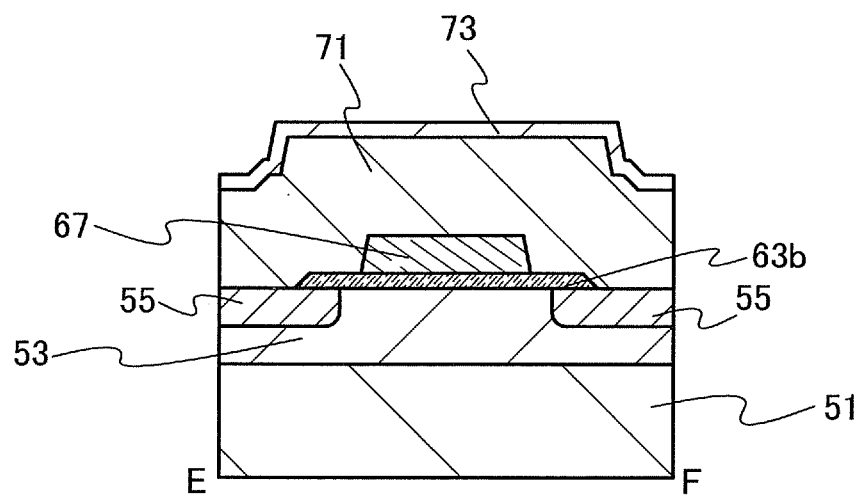

A transistor illustrated in FIGS. 2A and 2B is an example of a preferable embodiment. FIG. 2A is a top view of the transistor, and FIG. 2B is a cross-sectional view along dashed and dotted line E-F in FIG. 2A. A cross section along dashed and dotted line A-B and a cross section along dashed and dotted line C-D in FIG. 2A correspond to cross sections in FIG. 1B and FIG. 1C, respectively. In the transistor, in the channel width direction, the end portions of the pair of electrodes 67 and 69 are located on the inner side than the end portions of the first oxide insulating film 53 (see FIG. 2A). When the description is made with reference to FIG. 2B, the width of each of the pair of electrodes 67 and 69 in the channel width direction is shorter than the width of a portion which protrudes (a projecting portion) of the first oxide insulating film. In this way, generation of a parasitic channel in the region of the oxide semiconductor film 63 which is on the outer side than the pair of electrode 67 and 69 in the channel width direction can be reduced, which leads to a reduction in leakage current of the transistor.

The oxide semiconductor film 63 is an oxide semiconductor film containing at least one kind of element selected from In, Ga, Sn, and Zn. Typically, a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide or a Sn—Zn—O-based metal oxide; a one-component metal oxide such as ZnO, SnO, or InO; or the like can be used for the oxide semiconductor film 63. Moreover, silicon oxide may be contained in the above oxide semiconductor. Here, for example, an In—Ga—Zn—O-based material means an oxide containing indium (In), gallium (Ga), and zinc (Zn), and there is no particular limitation on the composition ratio. The In—Ga—Zn—O-based material may further contain an element other than indium, gallium, and zinc. Here, the amount of oxygen in the above oxide semiconductor film preferably exceeds the stoichiometric proportion of oxygen. When the amount of oxygen exceeds the stoichiometric proportion, generation of carriers which results from oxygen vacancies in the oxide semiconductor film can be suppressed.

In the case where an In—Zn—O-based metal oxide material is used as the oxide semiconductor film, the atomic ratio thereof is In/Zn=0.5 to 50, preferably In/Zn=1 to 20, more preferably In/Zn=3 to 30. When the atomic ratio of In to Zn is in the above preferred range, the field-effect mobility of the transistor can be improved. Here, when the atomic ratio of the compound is In:Zn:O=X:Y:Z, the relation Z>1.5X+Y is satisfied.

Note that the energy gap of a metal oxide which can form the oxide semiconductor film 63 is greater than or equal to 2 eV, preferably greater than or equal to 2.5 eV, more preferably greater than or equal to 3 eV. In this manner, the off-state current of the transistor can be reduced by using an oxide semiconductor having a wide energy gap.

The oxide semiconductor film 63 may have an amorphous structure.

As the oxide semiconductor film 63, a c-axis aligned crystalline oxide semiconductor (CAAC-OS) film including crystallized parts may be used.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°. Note that part of oxygen included in the oxide semiconductor film may be substituted with nitrogen.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in the transistor, change in electric characteristics of the transistor due to irradiation with visible light or ultraviolet light can be reduced. Thus, the transistor has high reliability.

The thickness of the oxide semiconductor film 63 is greater than or equal to 1 nm and less than or equal to 50 nm, preferably greater than or equal to 1 nm and less than or equal to 30 nm, more preferably greater than or equal to 1 nm and less than or equal to 10 nm, still more preferably greater than or equal to 3 nm and less than or equal to 7 nm. When the oxide semiconductor film 63 has a thickness in the above range, a short-channel effect of the transistor can be suppressed.

The concentration of alkali metals or alkaline earth metals in the oxide semiconductor film 63 is preferably lower than or equal to $1\times10^{18}$ atoms/cm$^3$, more preferably lower than or equal to $2\times10^{16}$ atoms/cm$^3$. This is because an alkali metal and an alkaline earth metal are bonded to an oxide semiconductor and generate carriers in some cases and cause an increase in off-state current of the transistor.

The first region 63a of the oxide semiconductor film 63 may contain nitrogen at a concentration of lower than or equal to $5\times10^{18}$ atoms/cm$^3$.

Further, the concentration of hydrogen in the first region 63a of the oxide semiconductor film 63 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, still more preferably lower than or equal to $1\times10^{16}$ atoms/cm$^3$. By a bond of an oxide semiconductor and hydrogen, part of hydrogen serves as a donor to generate an electron which is a carrier. For that reason, by a reduction in the concentration of hydrogen in the first region 63a of the oxide semiconductor film 63, a negative shift of the threshold voltage can be reduced.

The pair of second regions 63b and 63c contain, as dopant, at least one of boron, nitrogen, phosphorus, and arsenic. Alternatively, the pair of second regions 63b and 63c contain, as dopant, at least one of helium, neon, argon, krypton, and xenon. Still alternatively, the pair of second regions 63b and 63c may contain, as dopant, at least one of boron, nitrogen, phosphorus, and arsenic and at least one of helium, neon, argon, krypton, and xenon in appropriate combination.

The concentration of the dopant in the pair of second regions 63b and 63c is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the pair of second regions 63b and 63c contain dopant, the carrier density or the number of defects can be increased. Therefore, the conductivity can be higher than that of the first region 63a which does not contain dopant. Note that an excessive increase in the concentration of dopant causes inhibition of carrier movement by the dopant, which leads to a reduction in conductivity of the pair of second regions 63b and 63c containing dopant.

The pair of second regions 63b and 63c containing dopant preferably has a conductivity of higher than or equal to 0.1 S/cm and lower than or equal to 1000 S/cm, preferably higher than or equal to 10 S/cm and lower than or equal to 1000 S/cm.

The existence of the pair of second regions 63b and 63c containing dopant in the oxide semiconductor film 63 can relieve an electric field applied to the end portion of the first region 63a serving as a channel region. Thus, a short-channel effect of the transistor can be suppressed.

The pair of electrodes 67 and 69 are formed to have a single-layer structure or a stacked-layer structure including, as a conductive material, any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used. Note that the pair of electrodes 67 and 69 may be made to function as wirings.

As illustrated in FIGS. 1A and 1C, in the case where the pair of electrodes 67 and 69 each cover an exposed region and part of a side surface parallel with the channel width direction of the oxide semiconductor film 63, the contact area between the pair of electrodes 67 and 69 and the oxide semiconductor film 63 can be increased. Accordingly, the contact resistance between the oxide semiconductor film 63 and the pair of electrodes 67 and 69 can be reduced.

The gate insulating film 59 may be formed with a single layer or a stack using, for example, one or more of silicon oxide, silicon oxynitride, silicon nitride oxide, silicon nitride, aluminum oxide, hafnium oxide, gallium oxide, a Ga—Zn—O-based metal oxide, and the like. The gate insulating film 59 may also be an oxide insulating film from which oxygen is released by heating as described as a film that can be used as the first oxide insulating film 53. By using a film from which oxygen is released by heating as the gate insulating film 59, oxygen vacancies formed in the oxide semiconductor film 63 can be reduced and deterioration in electric characteristics of the transistor can be suppressed.

The gate insulating film 59 may be formed using a high-k material such as hafnium silicate (HfSiO$_x$) (x>0), hafnium silicate to which nitrogen is added (HfSi$_x$O$_y$N$_z$) (x>0, y>0, z>0), hafnium aluminate to which nitrogen is added (HfAl$_x$O$_y$N$_z$) (x>0, y>0, z>0), hafnium oxide, or yttrium oxide, so that gate leakage current can be decreased.

The thickness of the gate insulating film 59 is preferably greater than or equal to 10 nm and less than or equal to 300 nm, more preferably greater than or equal to 5 nm and less than or equal to 50 nm, still more preferably greater than or equal to 10 nm and less than or equal to 30 nm.

The gate electrode 61 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. The gate electrode 61 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 61 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

As a material layer in contact with the gate insulating film 59, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN)

is preferably provided between the gate electrode 61 and the gate insulating film 59. These films each have a work function of higher than or equal to 5 eV, preferably higher than or equal to 5.5 eV; thus, the threshold voltage in the electric characteristics of the transistor can be positive. Accordingly, a so-called normally-off switching element can be obtained. For example, in the case of using an In—Ga—Zn—O film containing nitrogen, an In—Ga—Zn—O film having at least a higher nitrogen concentration than the oxide semiconductor film 63, specifically, an In—Ga—Zn—O film having a nitrogen concentration of higher than or equal to 7 at.% is used.

The sidewall insulating film 65 may be, for example, formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. The sidewall insulating film 65 may be formed using an oxide insulating film from which part of oxygen is released by heating in a manner similar to that of the first oxide insulating film 53.

In the transistor described in this embodiment, since the pair of electrodes 67 and 69 do not overlap with the gate electrode 61, parasitic capacitance between the pair of electrodes 67 and 69 and the gate electrode 61 can be reduced. Therefore, high-speed operation of the transistor can be achieved. End portions of the pair of electrodes 67 and 69 of the transistor are located over the sidewall insulating films 65 and cover all the exposed portions of the pair of second regions 63b and 63c containing dopant in the oxide semiconductor film 63. Therefore, the length of a region for relieving an electric field in the channel length direction is controlled with the length of the sidewall insulating film 65, so that a high accuracy in aligning a mask for forming the pair of electrodes 67 and 69 is not strictly required. Accordingly, variation among plural transistors can be reduced.

The insulating films 71 and 73 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. The insulating film 71 may be formed using an oxide insulating film from which part of oxygen is released by heating in a manner similar to that of the first oxide insulating film 53. When the insulating film 73 is formed using an oxide insulating film which prevents diffusion of oxygen to the outside in a manner similar to that of the second oxide insulating film 55, oxygen released from the insulating film 71 can be supplied to the oxide semiconductor film. In addition, by using an oxide insulating film which prevents diffusion of hydrogen from the outside as the insulating film 73, diffusion of hydrogen from the outside to the oxide semiconductor film can be reduced, and oxygen vacancies in the oxide semiconductor film can be reduced. Typical examples of the oxide insulating film which prevents diffusion of hydrogen from the outside include films of silicon nitride, silicon nitride oxide, aluminum nitride, aluminum nitride oxide, and the like.

Although the transistor in which opposite regions of the pair of electrodes 67 and 69 are linear has been used in this embodiment, the opposite regions of the pair of electrodes 67 and 69 may be U-shaped or C-shaped as appropriate, for example. A transistor with such a structure can have an increased channel width; accordingly, the on-state current can be increased.

Next, a method for manufacturing the transistor illustrated in FIGS. 1A to 1C will be described with reference to FIGS. 3A to 3J, FIGS. 4A to 4H, and FIGS. 5A to 5F. Note that manufacturing steps of cross section A-B (in the channel width direction of the transistor) in FIG. 1B are illustrated in FIGS. 3A, 3C, 3E, 3G, and 3I, FIGS. 4A, 4C, 4E, and 4G, and FIGS. 5A, 5C, and 5E, whereas manufacturing steps of cross section C-D (in the channel length direction of the transistor) in FIG. 1C are illustrated in FIGS. 3B, 3D, 3F, 3H, and 3J, FIGS. 4B, 4D, 4F, and 4H, and FIGS. 5B, 5D, and 5F.

Figure 3A:
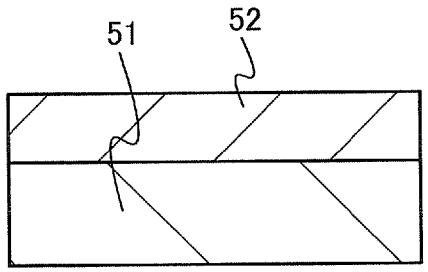
FIGS. 3A to 3J are cross-sectional views illustrating a manufacturing method of a semiconductor device according to an embodiment of the present invention.
Figure 3B:
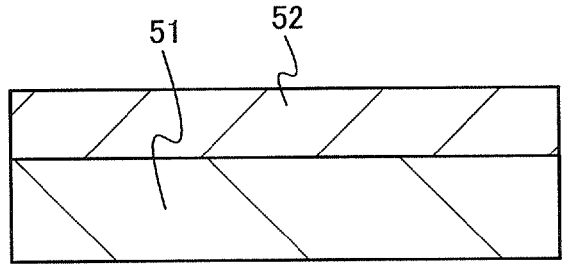

As illustrated in FIGS. 3A and 3B, a first oxide insulating film 52 is formed over the substrate 51.

Since the first oxide insulating film 52 becomes the first oxide insulating film 53 later, the materials given for the first oxide insulating film 53 in FIGS. 1A to 1C can be used as appropriate. The first oxide insulating film 52 is formed by a sputtering method, a CVD method, or the like. An oxide insulating film from which part of oxygen is released by heating can easily be formed by a sputtering method, which is preferable.

When the oxide insulating film from which part of oxygen is released by heating is formed by a sputtering method, the amount of oxygen in a deposition gas is preferably large, and oxygen, a mixed gas of oxygen and a rare gas, or the like can be used. Typically, the oxygen concentration in a deposition gas is preferably higher than or equal to 6% and lower than or equal to 100%.

In the case where a silicon oxide film is formed as a typical example of an oxide insulating film from which part of oxygen is released by heating, the silicon oxide film is preferably formed by an RF sputtering method under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa), the high-frequency power is higher than or equal to 0.5 kW and lower than or equal to 12 kW (preferably higher than or equal to 1 kW and lower than or equal to 5 kW); and the proportion of oxygen in the deposition gas ($O_2/(O_2+Ar)$) is greater than or equal to 1% and less than or equal to 100% (preferably greater than or equal to 6% and less than or equal to 100%). Note that a silicon target may be used as the target instead of the quartz (preferably synthetic quartz) target. In addition, oxygen alone may be used as the deposition gas.

Note that before the first oxide insulating film 52 is formed, hydrogen contained in the substrate is preferably released by heat treatment or plasma treatment. Consequently, in heat treatment performed later, diffusion of hydrogen to the first oxide insulating film, the second oxide insulating film, and the oxide semiconductor film can be prevented. The heat treatment is performed at a temperature of higher than or equal to 100° C. and lower than the strain point of the substrate in an inert atmosphere, a reduced-pressure atmosphere, or a dry air atmosphere. Further, for the plasma treatment, a rare gas, oxygen, nitrogen, or nitrogen oxide (e.g., nitrous oxide, nitrogen monoxide, or nitrogen dioxide) is used.

Figure 3C:
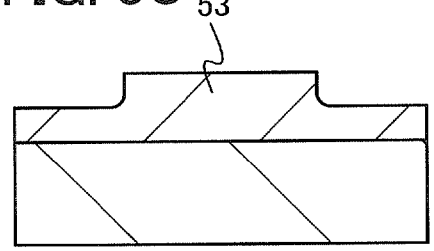
Figure 3D:
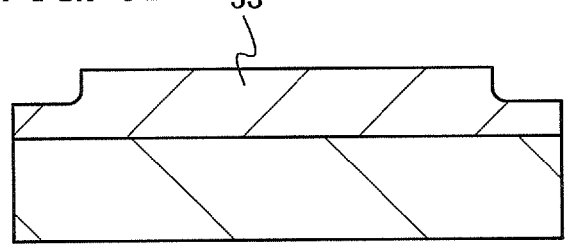

Then, a mask is formed over the first oxide insulating film 52, and part of the first oxide insulating film 52 is etched, whereby the first oxide insulating film 53 having a projecting portion is formed as illustrated in FIGS. 3C and 3D. Herein, the mask is formed over the first oxide insulating film 52 such that the projecting portion is formed in the vicinity of a region where the oxide semiconductor film is formed, and the first oxide insulating film 52 is etched.

The first oxide insulating film 52 can be etched by one of or both wet etching and dry etching.

Figure 3E:
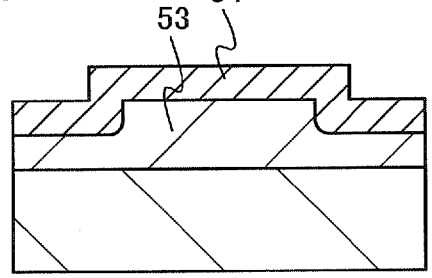
Figure 3F:
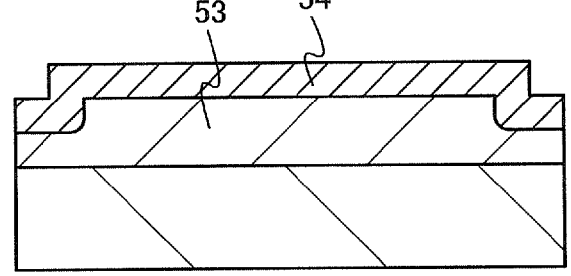

Next, as illustrated in FIGS. 3E and 3F, a second oxide insulating film 54 is formed over the first oxide insulating film 53.

The second oxide insulating film 54 becomes the second oxide insulating film 55 later, so that the materials given for the second oxide insulating film 55 illustrated in FIGS. 1A to 1C can be used as appropriate. The second oxide insulating film 54 is formed by a sputtering method, a CVD method, or the like. The second oxide insulating film 54 is preferably formed so as to have a thickness that is at least larger than the depth that is etched in the first oxide insulating film 52. Consequently, in a later step for planarizing the first oxide insulating film and the second oxide insulating film, the first oxide insulating film and the second oxide insulating film which are highly planarized can be formed.

Figure 3G:
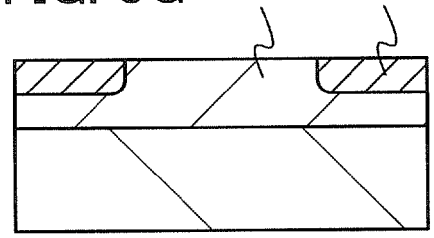
Figure 3H:
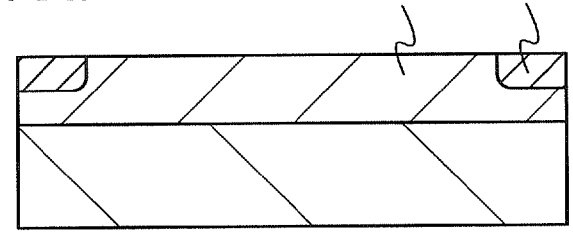

Then, by planarizing the first oxide insulating film 53 and the second oxide insulating film 54, the second oxide insulating film 55 is formed as illustrated in FIGS. 3G and 3H. In the planarization treatment, part of the first oxide insulating film 53 may be etched off.

As the planarization treatment, chemical mechanical polishing (CMP) treatment is preferably performed. Here, the CMP treatment is treatment for planarizing a surface of an object to be processed by a combination of chemical and mechanical actions using the surface as a reference. In general, the CMP treatment is treatment in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

The CMP treatment may be performed once or plural times. When the CMP treatment is performed plural times, first polishing is preferably performed with a high polishing rate followed by final polishing with a low polishing rate. By performing polishing treatment with different polishing rates in combination, the planarity of the surfaces of the first oxide insulating film 53 and the second oxide insulating film 54 can be further increased.

As treatment for planarizing the first oxide insulating film 53 and the second oxide insulating film 54, dry etching treatment or the like can be performed in addition to CMP treatment. For the etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate. For example, a dry etching method such as an reactive ion etching (RIE) method, an inductively coupled plasma (ICP) etching method, an electron cyclotron resonance (ECR) etching method, a parallel-plate (capacitively coupled plasma) etching method, a magnetron plasma etching method, a dual-frequency plasma etching method, or a helicon wave plasma etching method can be used.

As treatment for planarizing the first oxide insulating film 53 and the second oxide insulating film 54, plasma treatment or the like can be used in addition to CMP treatment. The plasma treatment is performed in such a manner that an inert gas such as an argon gas is introduced into a vacuum chamber and an electric field is applied so that a surface to be processed serves as a cathode. The plasma treatment has a principle similar to that of a plasma dry etching method, and is a simpler method because treatment in a general sputtering deposition chamber can be used by using an inert gas. That is, the plasma treatment is treatment in which the surface to be processed is irradiated with ions of an inert gas and minute unevenness of the surface is reduced by a sputtering effect. Therefore, the plasma treatment is also referred to as "reverse sputtering" in this specification.

In the reverse sputtering, electrons and argon cations are present in plasma and the argon cations are accelerated in the cathode direction. The surface to be processed is sputtered by the argon cations which are accelerated. At that time, a projecting portion of the surface to be processed is preferentially sputtered. Particles generated by sputtering from the surface to be processed attach to another place of the surface to be processed. At that time, the particles preferentially attach to a depressed portion of the surface to be processed. In this manner, by reducing the projecting portion and filling the depressed portion, the planarity of the surface to be processed can be improved.

The surfaces of the first oxide insulating film 53 and the second oxide insulating film 55 are preferably flat because the oxide semiconductor film formed later can be prevented from being disconnected.

Figure 3I:
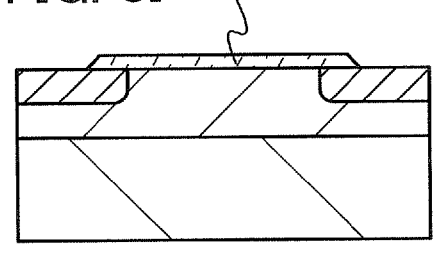
Figure 3J:
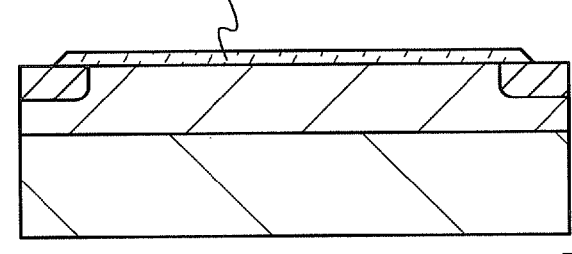

Next, an oxide semiconductor film 57 is formed over the first oxide insulating film 53 as illustrated in FIGS. 3I and 3J. The oxide semiconductor film 57 is formed such that as illustrated in FIGS. 3I and 3J, at surfaces of the first oxide insulating film 53 and the second oxide insulating film 55 which are in contact with the oxide semiconductor film 57, the boundary between the first oxide insulating film 53 and the second oxide insulating film 55 is located on the inner side than a side surface of the oxide semiconductor film 57.

The oxide semiconductor film 57 can be formed by a sputtering method, a coating method, a printing method, a pulsed laser deposition method, a laser ablation method, or the like.

Here, the oxide semiconductor film 57 is formed by a sputtering method in such a manner that an oxide semiconductor film with a thickness of greater than or equal to 1 nm and less than or equal to 50 nm, preferably greater than or equal to 3 nm and less than or equal to 30 nm is formed, a mask is formed over the oxide semiconductor film, and part of the oxide semiconductor film is etched.

A sputtering apparatus used for forming the oxide semiconductor film will be described in detail below.

The leakage rate of a treatment chamber in which the oxide semiconductor film is formed is preferably lower than or equal to $1 \times 10^{-10}$ Pa·m$^3$/sec., whereby entry of an impurity into the film to be formed by a sputtering method can be decreased.

In order to decrease the leakage rate, internal leakage as well as external leakage needs to be reduced. The external leakage refers to inflow of a gas from the outside of a vacuum system through a minute hole, a sealing defect, or the like. The internal leakage is due to leakage through a partition, such as a valve, in a vacuum system or due to a released gas from an internal member. Measures need to be taken from both aspects of external leakage and internal leakage in order that the leakage rate be lower than or equal to $1 \times 10^{-10}$ Pa·m$^3$/sec.

In order to decrease external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, with the use of a metal material covered with iron fluoride, aluminum oxide, chromium oxide, or the like which is in the passive state, a released gas containing hydrogen generated from the metal gasket is suppressed, so that the internal leakage can also be reduced.

As a member for forming an inner wall of the treatment chamber, aluminum, chromium, titanium, zirconium, nickel, or vanadium, from which the amount of a released gas containing hydrogen is small, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the deposition apparatus may be covered with iron fluoride, aluminum oxide, chromium oxide, or the like which is in the passive state.

Furthermore, it is preferable to provide a refiner for a sputtering gas just in front of the treatment chamber. At this time, the length of a pipe between the gas refiner and the treatment chamber is less than or equal to 5 m, preferably less than or equal to 1 m. When the length of the pipe is less than or equal to 5 m or less than or equal to 1 m, the adverse effect of the released gas from the pipe can be reduced accordingly.

Evacuation of the treatment chamber is preferably performed with rough vacuum pumps such as a dry pump and high vacuum pumps such as a sputter ion pump, a turbo molecular pump, and a cryopump in appropriate combination. The turbo molecular pump has an outstanding capability in removing a large-sized molecule, whereas it has a low capability in removing hydrogen or water. Hence, combination with a cryopump having a high capability in removing water or a sputter ion pump having a high capability in removing hydrogen is effective.

An adsorbate inside the treatment chamber does not affect the pressure in the treatment chamber because it is adsorbed on the inner wall, but leads to a release of a gas at the time of the evacuation of the treatment chamber. Therefore, although the leakage rate and the evacuation rate do not have a correlation, it is important that the adsorbate present in the treatment chamber be released as much as possible and evacuation be performed in advance with the use of a pump having high evacuation capability. Note that the treatment chamber may be subjected to baking for promotion of a release of the adsorbate. By the baking, the rate of desorption of the adsorbate can be increased about tenfold. The baking should be performed at a temperature of higher than or equal to 100° C. and lower than or equal to 450° C. At this time, when the adsorbate is removed while an inert gas is introduced, the rate of desorption of water or the like, which is difficult to desorb only by evacuation, can be further increased.

As described above, in the process for forming the oxide semiconductor film and preferably in the process for forming the oxide insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

Hydrogen contained in the oxide semiconductor is reacted with oxygen bonded to a metal atom to be water, and in addition, a vacancy is formed in a lattice from which oxygen is released (or a portion from which oxygen is removed). Thus, the impurities containing hydrogen are reduced as much as possible in the formation step of the oxide semiconductor film, whereby vacancies in the oxide semiconductor film can be reduced. Therefore, when a channel region is formed in an oxide semiconductor film which is highly purified by removing impurities as much as possible, the transistor can have higher reliability.

In a sputtering method, an RF power supply device, an AC power supply device, a DC power supply device, or the like can be used as a power supply device for generating plasma as appropriate.

As a target, a metal oxide target containing zinc can be used. As the target, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide or a Sn—Zn—O-based metal oxide, or a one-component metal oxide such as a ZnO-based metal oxide or a SnO-based metal oxide can be used.

As an example of the target, a metal oxide target containing In, Ga, and Zn has a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used. Alternatively, a target having a composition ratio where $In_2O_3:ZnO=25:1$ to $1:4$ [molar ratio] can be used.

As a sputtering gas, a rare gas (typically argon), oxygen, or a mixed gas of a rare gas and oxygen is used as appropriate. In the case of using the mixed gas of a rare gas and oxygen, the proportion of oxygen is preferably higher than that of a rare gas. It is preferable that a high-purity gas from which impurities containing hydrogen are removed be used as a sputtering gas.

Note that before the oxide semiconductor film is formed by a sputtering apparatus, a dummy substrate may be put into the sputtering apparatus, and an oxide semiconductor film may be formed over the dummy substrate, so that hydrogen and moisture attached to the target surface or a deposition shield may be removed.

Figure 4A:
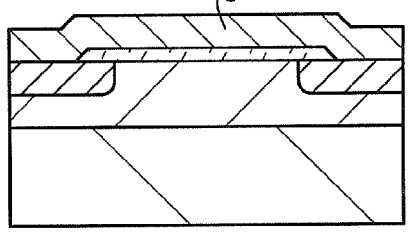
FIGS. 4A to 4H are cross-sectional views illustrating a manufacturing method of a semiconductor device according to an embodiment of the present invention.
Figure 4B:
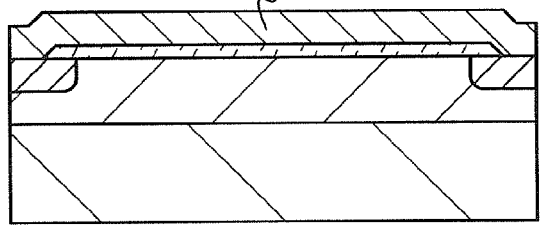

Next, an insulating film 58 is formed over the first oxide insulating film 53, the second oxide insulating film 55, and the oxide semiconductor film 57 as illustrated in FIGS. 4A and 4B.

Since the insulating film 58 becomes the gate insulating film later, the materials given for the gate insulating film 59 illustrated in FIGS. 1A to 1C can be used as appropriate. In addition, the insulating film 58 is formed by a sputtering method, a CVD method, or the like.

Next, heat treatment is performed on the substrate 51, whereby hydrogen is released from the oxide semiconductor film 57 and part of oxygen contained in the first oxide insulating film 53 is diffused to the oxide semiconductor film 57, the vicinity of the interface between the first oxide insulating film 53 and the oxide semiconductor film 57, the side surfaces of the oxide semiconductor film 57, that is, the vicinity of the interface between the oxide semiconductor film 57 and the insulating film 58. During the heat treatment illustrated in FIG. 4A, the end portion of the oxide semiconductor film 57 is located over the second oxide insulating film 55. That is, the first oxide insulating film 53 on the side in contact with the oxide semiconductor film 57, except a region in contact with the second oxide insulating film 55, is all in contact with the oxide semiconductor film 57. Therefore, diffusion of oxygen from the first oxide insulating film 53 to the outside is prevented by the oxide semiconductor film 57 in addition to the second oxide insulating film 55. In this way, release of excess oxygen from the first oxide insulating film 53 is not caused and oxygen remains in the first oxide insulating film 53. Accordingly, oxygen released from the first oxide insulating film 53 is preferentially and efficiently diffused to the oxide semiconductor film 57 and the vicinity of the interface between the first oxide insulating film 53 and the oxide semiconductor film 57.

In addition, since the oxide semiconductor film 57 is also in contact with the second oxide insulating film 55 which prevents diffusion of oxygen released from the first oxide insulating film 53, there is a possibility that oxygen is not diffused from the first oxide insulating film 53 to the end portions of the oxide semiconductor film 57. However, oxygen is diffused by heat treatment also from the insulating film 58 in contact with the oxide semiconductor film 57 to the side surfaces of the oxide semiconductor film 57, that is, the vicinity of the interface between the oxide semiconductor film 57 and the insulating film 58. Therefore, oxygen vacancies at the side surface of the oxide semiconductor film 57 and a region in the vicinity of the side surface of the oxide semiconductor film 57 can be reduced.

Figure 4C:
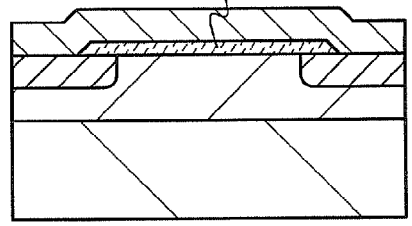
Figure 4D:
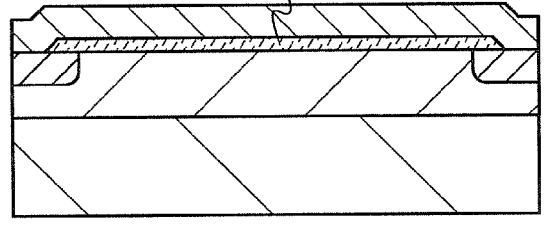
Figure 4E:
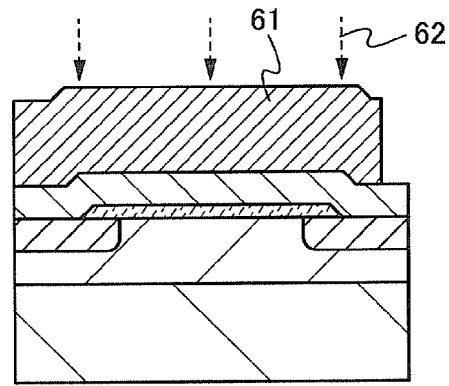
Figure 4F:
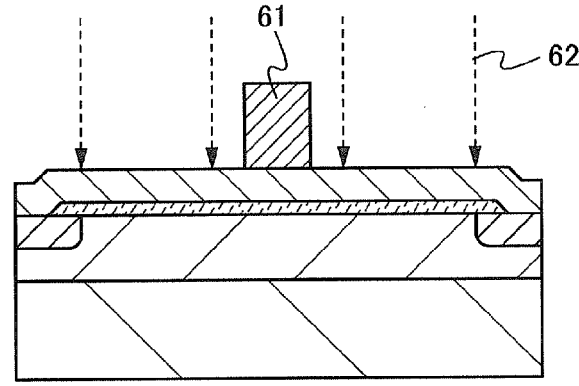
Figure 4G:
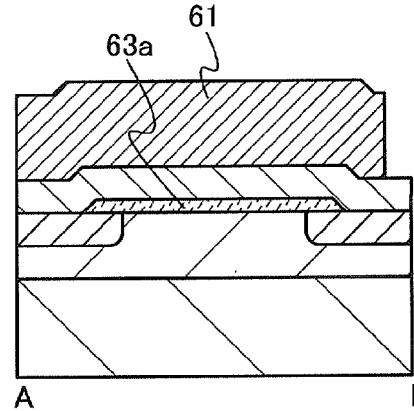

The surface of the first oxide insulating film 53 which crosses the channel length direction of the transistor illustrated in FIG. 4B is covered with the oxide semiconductor film 57, and the first oxide insulating film 53 is surrounded by the second oxide insulating film 55 which suppresses diffusion of oxygen. Therefore, in the heat treatment, oxygen contained in the first oxide insulating film 53 is preferentially diffused to the oxide semiconductor film 57, so that oxygen vacancies in the oxide semiconductor film and the vicinity of the interface of the oxide semiconductor film which is in contact with the first oxide insulating film can be reduced. Accordingly, an oxide semiconductor film 60 in which the hydrogen concentration and oxygen vacancies are reduced can be formed as illustrated in FIGS. 4C and 4D.

The temperature of the heat treatment is preferably a temperature at which hydrogen is released from the oxide semiconductor film 57 and part of oxygen contained in the first oxide insulating film 53 is released and diffused to the oxide semiconductor film 57. The temperature is typically higher than or equal to 150° C. and lower than the strain point of the substrate, preferably higher than or equal to 250° C. and lower than or equal to 450° C., more preferably higher than or equal to 300° C. and lower than or equal to 450° C.

A rapid thermal annealing (RTA) apparatus can be used for the heat treatment. With the use of the RTA, only in a short time, the heat treatment can be performed at a temperature of higher than or equal to the strain point of the substrate. Thus, the time during which hydrogen is released from the oxide semiconductor film 57 and the time during which oxygen is diffused from the first oxide insulating film 53 to the oxide semiconductor film 57 can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is from 3 minutes to 24 hours.

Then, the gate electrode 61 is formed over the insulating film 58.

The gate electrode 61 is formed by a printing method or an inkjet method. Alternatively, after a conductive film is formed by a sputtering method, a CVD method, an evaporation method, or the like, a mask is formed over the conductive film and the conductive film is etched, whereby the gate electrode 61 is formed. The mask formed over the conductive film can be formed by a printing method, an inkjet method, or a photolithography method as appropriate. In the case of forming the gate electrode 61 with the use of a mask, the mask is removed later.

Figure 4H:
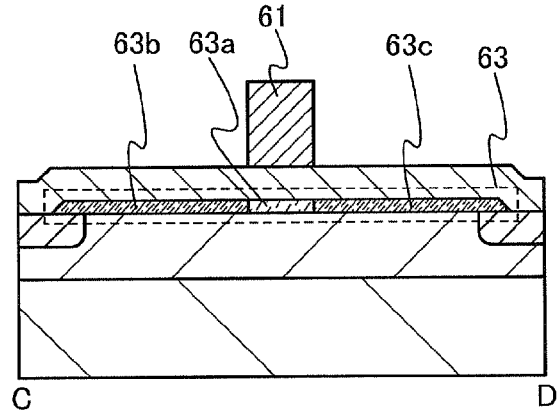

Then, by using the gate electrode 61 as a mask, a dopant 62 is added to the oxide semiconductor film 60 (see FIGS. 4E and 4F), so that the pair of second regions 63b and 63c containing dopant are formed as illustrated in FIG. 4H. Since the dopant is added with the use of the gate electrode 61 as a mask, the pair of second regions 63b and 63c containing dopant and the first region 63a to which the dopant is not added can be formed in a self-aligned manner (see FIG. 4H). The first region 63a which overlaps with the gate electrode 61 serves as a channel region. The pair of second regions 63b and 63c containing dopant serve as regions for relieving an electric field, a source region, and a drain region. The first region 63a, and the pair of second regions 63b and 63c containing dopant constitute the oxide semiconductor film 63.

As a method for adding the dopant to the oxide semiconductor film 60, an ion doping method or an ion implantation method can be used. As the dopant 62, at least one of boron, nitrogen, phosphorus, and arsenic can be added. Alternatively, as the dopant 62, at least one of helium, neon, argon, krypton, and xenon can be added. Still alternatively, as the dopant 62, at least one of boron, nitrogen, phosphorus, and arsenic and at least one of helium, neon, argon, krypton, and xenon in appropriate combination can be added.

The addition of the dopant 62 to the oxide semiconductor film 60 is conducted in a state where the oxide semiconductor film 60 is covered with the insulating film and the like; alternatively, the addition of the dopant 62 may be conducted in a state where the oxide semiconductor film 60 is exposed.

Alternatively, the dopant 62 can be added by a method other than an ion doping method, an ion implantation method, or the like. For example, the dopant can be added in the following manner: plasma is generated in an atmosphere of a gas containing an element to be added and plasma treatment is performed on an object to which the dopant is added. As an apparatus for generating plasma, a dry etching apparatus, a plasma CVD apparatus, a high-density plasma CVD apparatus, or the like can be used.

After that, heat treatment may be performed. The heat treatment is performed typically at a temperature of higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 63b and 63c containing dopant can be reduced. In the heat treatment, the pair of second regions 63b and 63c containing dopant may be in either a crystalline state or an amorphous state.

Figure 5A:
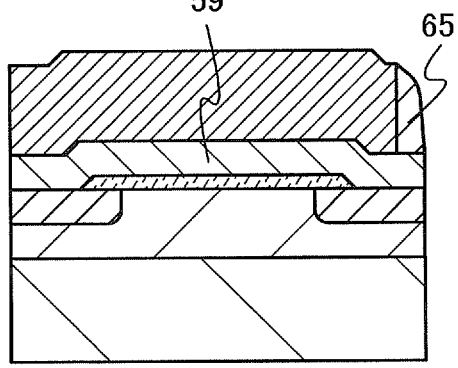
FIGS. 5A to 5F are cross-sectional views illustrating a manufacturing method of a semiconductor device according to an embodiment of the present invention.
Figure 5B:
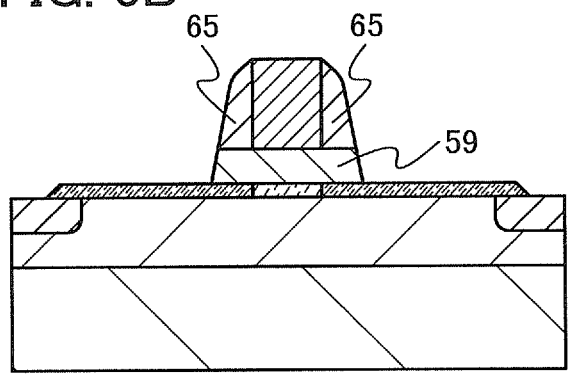

Next, as illustrated in FIGS. 5A and 5B, the sidewall insulating films 65 on the side surfaces of the gate electrode 61 and the gate insulating film 59 are formed. A method for forming the sidewall insulating films 65 is described below.

First, an insulating film to be the sidewall insulating films 65 is formed over the insulating film 58 and the gate electrode 61. The insulating film is formed by a sputtering method, a CVD method, or the like. In addition, although the thickness of the insulating film is not particularly limited, the thickness is selected as appropriate in consideration of coverage with respect to the shape of the gate electrode 61.

Then, the sidewall insulating film 65 is formed by etching the insulating film. The sidewall insulating film 65 can be formed in a self-aligned manner by performing a highly anisotropic etching step on the insulating film. Here, dry etching is preferably employed as highly anisotropic etching, and a gas including fluorine such as trifluoromethane ($CHF_3$), octafluorocyclobutane ($C_4F_8$), or tetrafluoromethane ($CF_4$) can be used as an etching gas. A rare gas such as helium (He) or argon (Ar) or hydrogen ($H_2$) may be added to the etching gas. In addition, as the dry etching, a reactive ion etching (RIE) method in which high-frequency voltage is applied to a substrate, is preferably used.

The width of the region for relieving an electric field in each of the pair of second regions 63b and 63c containing dopant depends on the width of the sidewall insulating film 65, and the width of the sidewall insulating film 65 depends on the thickness of the gate electrode 61. Therefore, the thickness of the gate electrode 61 may be determined so that the width of the region for relieving an electric field has a desired value.

When the sidewall insulating films 65 are formed, the insulating film 58 is also etched by highly anisotropic etching and the oxide semiconductor film 63 is partly exposed, whereby the gate insulating film 59 is formed.

Figure 5C:
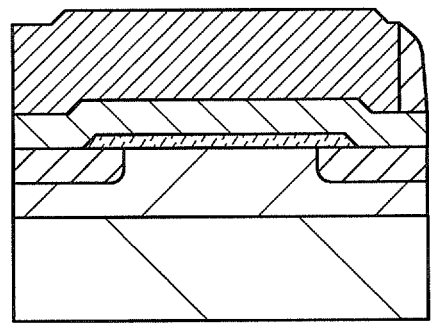
Figure 5D:
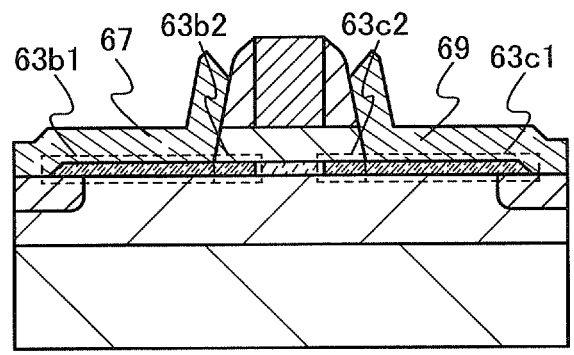

Next, the pair of electrodes 67 and 69 are formed as illustrated in FIGS. 5C and 5D.

After a conductive film is formed by a sputtering method, a CVD method, an evaporation method, or the like, a mask is formed over the conductive film and the conductive film is etched, whereby the pair of electrodes 67 and 69 are formed. The mask formed over the conductive film can be formed by a printing method, an inkjet method, or a photolithography method as appropriate. In the case of forming the pair of electrodes 67 and 69 with the use of the mask, the mask is removed later. The pair of electrodes 67 and 69 may also be formed by a printing method or an inkjet method.

The pair of electrodes 67 and 69 are preferably formed to be in contact with the side surfaces of the sidewall insulating films 65 and the gate insulating film 59. That is, end portions of the pair of electrodes 67 and 69 of the transistor are located over the sidewall insulating films 65 and entirely cover exposed portions of the pair of second regions 63b and 63c containing dopant in the oxide semiconductor film 63. As a result, regions 63b1 and 63c1 in the pair of second regions 63b and 63c containing dopant which are in contact with the pair of electrodes 67 and 69 serve as a source region and a drain region, whereas regions 63b2 and 63c2 in the pair of second regions 63b and 63c containing dopant which overlap with the sidewall insulating films 65 and the gate insulating film 59 serve as regions for relieving an electric field. In addition, since the width of the region for relieving an electric field can be controlled with the length of the sidewall insulating film 65, a high accuracy in alignment of a mask for forming the pair of electrodes 67 and 69 is not strictly required. Accordingly, variation among a plurality of transistors can be reduced.

Figure 5E:
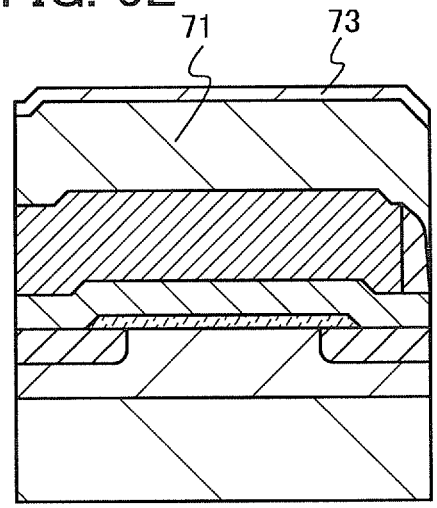
Figure 5F:
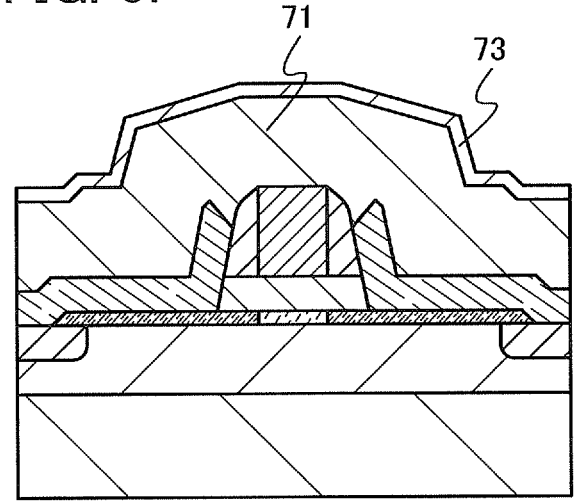

Then, the insulating film 71 and the insulating film 73 are formed as illustrated in FIGS. 5E and 5F.

The insulating film 71 and the insulating film 73 are formed by a sputtering method, a CVD method, a coating method, a printing method, or the like.

Through the above-described steps, the transistor can be manufactured.

The transistor described in this embodiment and a metal oxide semiconductor (MOS) transistor formed using a silicon on insulator (SOI) substrate are now compared with each other.

A MOS transistor formed using an SOI substrate includes a substrate, a buried oxide (BOX) layer formed over the substrate, a semiconductor region and an element separation region formed over the BOX layer, a gate insulating film formed over the semiconductor region, and a gate electrode formed over the gate insulating film.

An n-p-n region or a p-n-p region is formed for the semiconductor region. A source region, a drain region, and a lightly doped drain (LDD) region which is a region for relieving an electric field are formed by addition of an impurity element and activation treatment to reduce the resistance. The thickness of the semiconductor region is greater than or equal to 50 nm and less than or equal to 500 nm. Also in the case where the thickness of the semiconductor region is small, it is greater than or equal to 50 nm and less than or equal to 100 nm which is relatively large. This is because in the manufacturing process of the SOI substrate, the semiconductor region is thinned by CMP, etching, or the like, and in the thinning step, crystallinity is decreased or the number of defects is increased; thus, it is difficult to extremely thin the semiconductor region and it is necessary to set the thickness of the semiconductor region to be relatively large. In addition, as a method for suppressing a short-channel effect, channel doping in which an impurity having the opposite polarity is added to the channel region is performed. However, channel doping at a high concentration causes variation in threshold voltage due to statistical fluctuation of dopant; therefore, the amount of doping cannot be increased without limitation. That is, there is a limitation on the thickness of the semiconductor region and channel doping, and a short-channel effect cannot be completely suppressed.

The element separation region formed by a local oxidation of silicon (LOCOS) method or a shallow trench isolation (STI) method is provided in the periphery of the semiconductor region. In order to prevent disconnection of a gate wiring, the element separation region and the n-p-n region or the p-n-p region are subjected to planarization treatment so that surfaces thereof can be planarized.

Since the gate insulating film is formed by a thermal oxidation method, it is an insulating film having a thickness of as small as 1 nm to 2 nm. Leakage current between a source electrode and a drain electrode is several picoamperes to several nanoamperes, and leakage current between the semiconductor region and the gate electrode, that is, leakage current in the gate insulating film may also be several picoamperes to several nanoamperes; therefore, the thickness of the gate insulating film may be as small as 1 nm to 2 nm.

The transistor described in this embodiment includes a substrate, a base insulating film formed over the substrate, an oxide semiconductor film formed over the base insulating film, a gate insulating film formed over the oxide semiconductor film, and a gate electrode formed over the gate insulating film.

The base insulating film is at least partly in contact with the oxide semiconductor film and includes the first oxide insulating film from which part of oxygen is released by heating and the second oxide insulating film located in the periphery of the first oxide insulating film and formed using an oxide insulating film which prevents diffusion of oxygen to the outside. Therefore, oxygen contained in the first oxide insulating film in excess can be selectively diffused to the oxide semiconductor film. In addition, in order to prevent disconnection of the oxide semiconductor film, planarization treatment for planarizing the surface of the base insulating film is performed.

The oxide semiconductor film includes a channel region and regions for relieving an electric field between which the channel region is sandwiched. The region for relieving an electric field contains, as dopant, at least one of boron, nitrogen, phosphorus, and arsenic. Alternatively, the region for relieving an electric field contains, as dopant, at least one of helium, neon, argon, krypton, and xenon. Still alternatively, the region for relieving an electric field contains, as dopant, at least one of boron, nitrogen, phosphorus, and arsenic and at least one of helium, neon, argon, krypton, and xenon in appropriate combination. The thickness of the oxide semiconductor film can be extremely small, e.g., greater than or equal to 1 nm and less than or equal to 50 nm, preferably greater than or equal to 1 nm and less than or equal to 30 nm, more preferably greater than or equal to 1 nm and less than or equal to 10 nm, still more preferably greater than or equal to 3 nm and less than or equal to 7 nm. With the oxide semiconductor film being thin, a short-channel effect can be suppressed even without channel doping, so that the productivity can be improved.

The gate insulating film can be formed by a thin film deposition method such as a CVD method or a sputtering method and thus the thickness thereof can be selected from a wider range. In addition, leakage current between the semiconductor region and the gate electrode, that is, leakage current in the gate insulating film is substantially equal to the leakage current between the source electrode and the drain electrode and very small, that is, several yoctoamperes to several zeptoamperes. Thus, it is preferable that the thickness of the gate insulating film be set to an appropriate value by a thin film deposition method.

The transistor described in this embodiment is different from the MOS transistor formed using the SOI substrate in the component subjected to planarization treatment, the base insulating film of the semiconductor, a method for suppressing a short-channel effect, the thickness of the gate insulating film, the polarity of the channel region, and the like and thus it is difficult to form the transistor described in this embodiment easily on the basis of the MOS transistor.

In the transistor described in this embodiment, in the periphery of the first oxide insulating film from which part of oxygen is released by heating, the second oxide insulating film which can suppress diffusion of oxygen is provided. The oxide semiconductor film is provided over the first oxide insulating film and the second oxide insulating film; therefore, in the heat treatment, oxygen contained in the first oxide insulating film can be efficiently diffused to the oxide semiconductor film, so that oxygen vacancies in the oxide semiconductor film and the vicinity of the interface of the oxide semiconductor film which is in contact with the first oxide insulating film can be reduced. In addition, although the end portion of the oxide semiconductor film which crosses the channel width direction is located over the second oxide insulating film, oxygen can be diffused to a side surface of the oxide semiconductor film from the insulating film which is formed to cover the oxide semiconductor film, so that oxygen vacancies at the side surface are compensated by the oxygen. From the above, a negative shift of the threshold voltage of the transistor can be reduced, and in addition, electric characteristics of the transistor can be improved. With such structures of the transistor and the periphery thereof (including the base insulating film), the channel length of the transistor can be less than or equal to 100 nm, e.g., 30 nm. Also in such a case, the off-state current can be several yA/µm to several zA/µm.

The structures, methods, and the like described in this embodiment can be combined as appropriate with any of the structures, methods, and the like described in the other embodiments.

(Embodiment 2)

In this embodiment, a transistor having a structure different from that of Embodiment 1 and a method for manufacturing the transistor will be described with reference to FIGS. 6A to 6C. In this embodiment, the position of the end portion of the oxide semiconductor film which crosses the channel length direction of the transistor and the position of the interface between the first oxide insulating film 53 and the second oxide insulating film 55 are different from those in Embodiment 1.

Figure 6A:
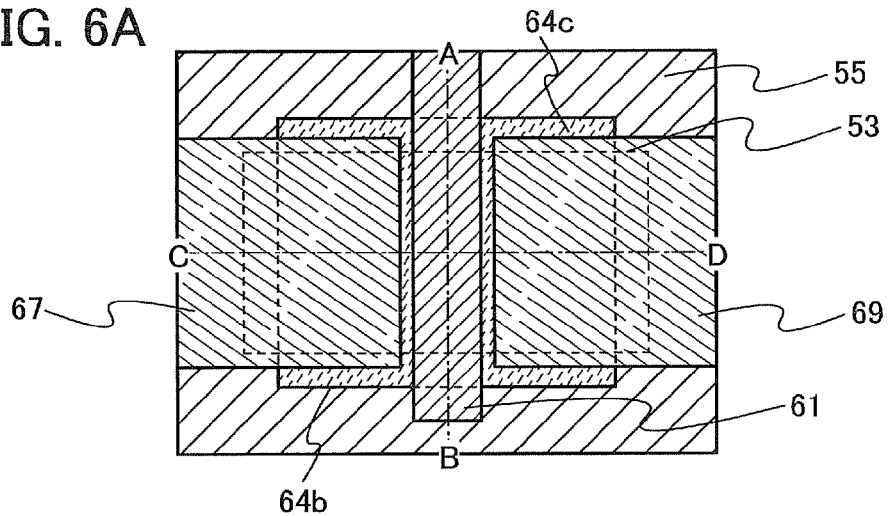
FIGS. 6A to 6C are a top view and cross-sectional views each illustrating a semiconductor device according to an embodiment of the present invention.
Figure 6B:
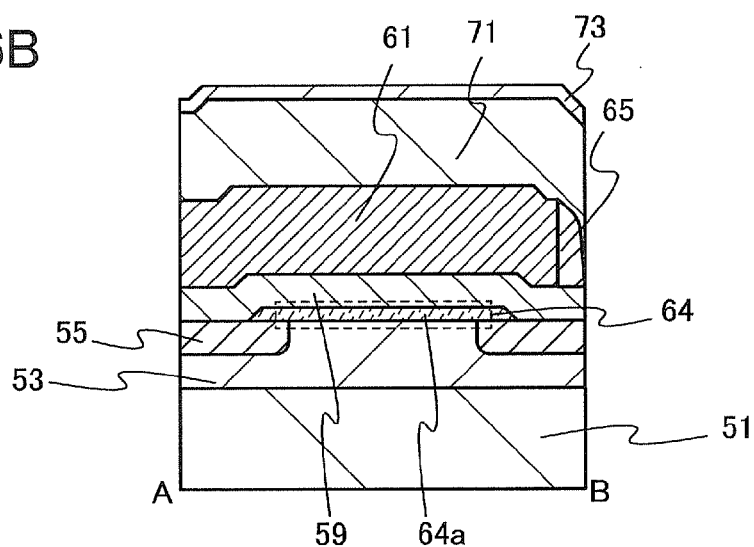
Figure 6C:
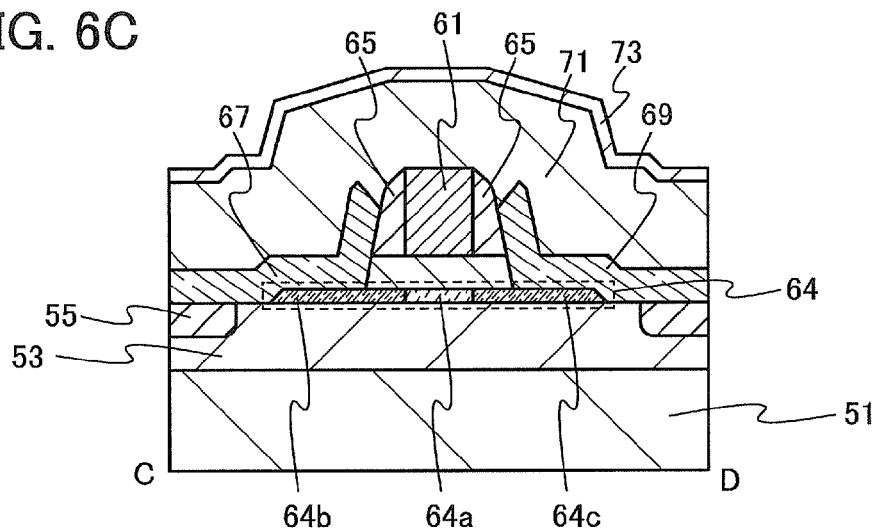

FIGS. 6A to 6C are a top view and cross-sectional views of a transistor described in this embodiment. FIG. 6A is a top view of the transistor described in this embodiment, FIG. 6B is a cross-sectional view taken along dashed-dotted line A-B in FIG. 6A, and FIG. 6C is a cross-sectional view taken along dashed-dotted line C-D in FIG. 6A. Note that in FIG. 6A, some of components of the transistor (e.g., a gate insulating film 59, sidewall insulating films 65, an insulating film 71, an insulating film 73, and the like) are omitted for simplicity.

The transistor illustrated in FIGS. 6A to 6C includes a first oxide insulating film 53 over a substrate 51, a second oxide insulating film 55 in the periphery of the first oxide insulating film 53, an oxide semiconductor film 64 over the first oxide insulating film 53 and the second oxide insulating film 55, a pair of electrodes 67 and 69 in contact with the oxide semiconductor film 64 and serving as a source electrode and a drain electrode, the gate insulating film 59 in contact with at least part of the oxide semiconductor film 64, and a gate electrode 61 over the gate insulating film 59 and overlapping with the oxide semiconductor film 64. The sidewall insulating films 65 in contact with side surfaces of the gate electrode 61 may be provided. The oxide semiconductor film 64 includes a first region 64a overlapping with the gate electrode 61 and a pair of second regions 64b and 64c containing dopant between which the first region 63a is sandwiched. In the oxide semiconductor film 64, the first region 64a serves as a channel region, regions in the pair of second regions 64b and 64c containing dopant which overlap with the sidewall insulating films 65 serve as regions for relieving an electric field, and regions in the pair of second regions 64b and 64c containing dopant which overlap with the pair of electrodes 67 and 69 serve as a source region and a drain region.

In this embodiment, the first oxide insulating film 53 and the second oxide insulating film 55 serve as a base insulating film of the oxide semiconductor film 64. In addition, as illustrated in FIG. 6B, an end portion of the oxide semiconductor film 64 which crosses the channel width direction of the transistor is located over the second oxide insulating film 55. That is, at surfaces of the first oxide insulating film and the second oxide insulating film which are in contact with the oxide semiconductor film, a boundary between the first oxide insulating film and the second oxide insulating film is located on the inner side than the side surface of the oxide semiconductor film 64.

In addition, as illustrated in FIG. 6C, the end portion of the oxide semiconductor film 64 which crosses the channel length direction of the transistor is located over the first oxide insulating film 53. That is, at the surfaces of the first oxide insulating film and the second oxide insulating film which are in contact with the oxide semiconductor film, the boundary between the first oxide insulating film and the second oxide insulating film is located on the outer side than the side surface of the oxide semiconductor film 64.

In the transistor illustrated in FIGS. 6A to 6C, instead of the oxide semiconductor film 63 formed in Embodiment 1, the oxide semiconductor film 64 is formed such that the end portion of the oxide semiconductor film 64 which crosses the channel length direction is located over the first oxide insulating film 53 and the end portion of the oxide semiconductor film 64 which crosses the channel width direction is located over the second oxide insulating film 55.

In accordance with this embodiment, hydrogen is released from the oxide semiconductor film 57 (FIGS. 3I to 3J, FIGS. 4A to 4H, and FIGS. 5A to 5F) and part of oxygen contained in the oxide insulating film 53 is diffused to the oxide semiconductor film 57, the vicinity of the interface between the oxide semiconductor film 57 and the first oxide insulating film 53, and the entire side surface of the oxide semiconductor film 57. That is, oxygen vacancies at the side surfaces of the oxide semiconductor film which cross the channel length direction and the channel width direction of the transistor can be reduced; moreover, oxygen vacancies in the oxide semiconductor film and the vicinity of the interface of the oxide semiconductor film which is in contact with the first oxide insulating film can be reduced. As a result, as illustrated in FIGS. 6A to 6C, the oxide semiconductor film 64 with a lowered hydrogen concentration and reduced oxygen vacancies can be formed. Through the above, a negative shift of the threshold voltage of the transistor can be reduced, and in addition, electric characteristics of the transistor can be improved.

The structures, methods, and the like described in this embodiment can be combined as appropriate with any of the structures, methods, and the like described in the other embodiments.

(Embodiment 3)

In this embodiment, a transistor having a structure different from those of Embodiments 1 and 2 and a method for manufacturing the transistor will be described with reference to FIGS. 7A and 7B. The transistor in this embodiment includes a pair of wirings in contact with a pair of electrodes, which is a point different from Embodiments 1 and 2. This embodiment will be described as another embodiment of the transistor in Embodiment 2; however, the structure of this embodiment can be applied to the transistor described in Embodiment 1 as appropriate.

Figure 7A:
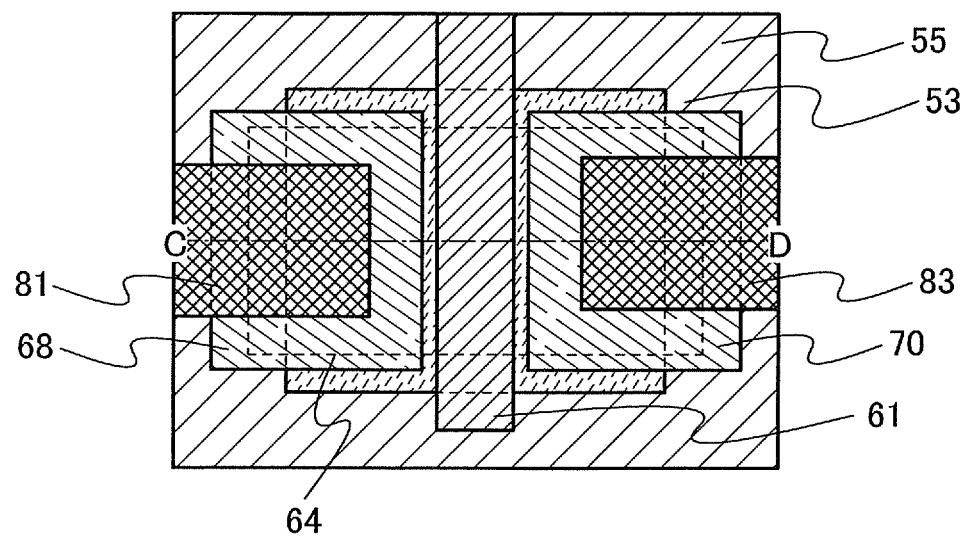
FIGS. 7A and 7B are a top view and a cross-sectional view each illustrating a semiconductor device according to an embodiment of the present invention.
Figure 7B:
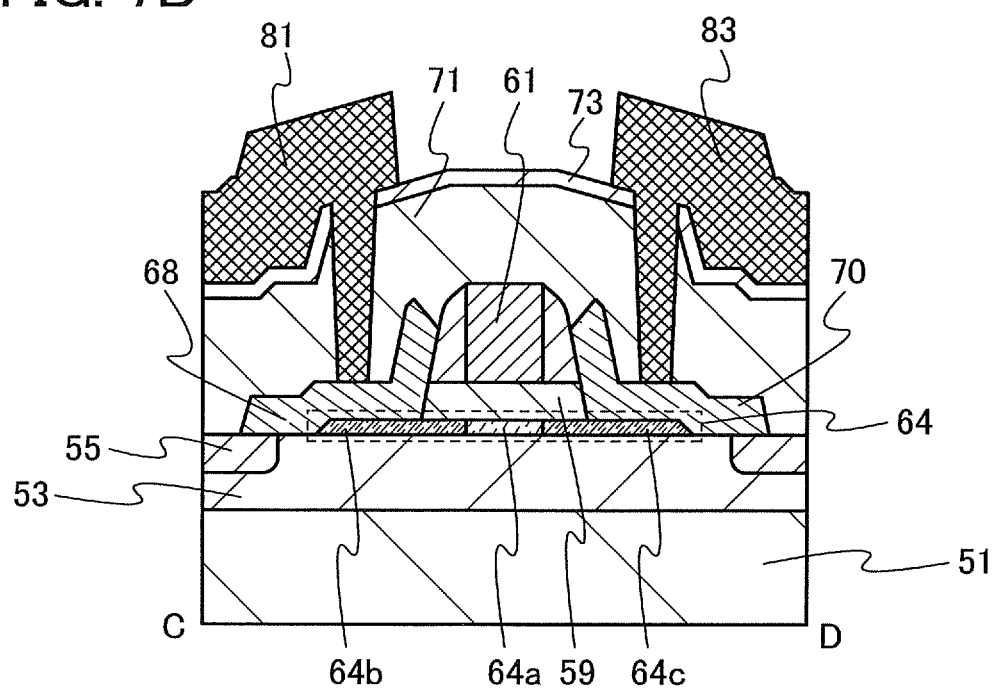

FIGS. 7A and 7B are a top view and a cross-sectional view of a transistor described in this embodiment. FIG. 7A is a top view of the transistor described in this embodiment and FIG. 7B is a cross-sectional view taken along dashed-dotted line C-D in FIG. 7A. Note that in FIG. 7A, some of components of the transistor (e.g., a gate insulating film 59, sidewall insulating films 65, an insulating film 71, an insulating film 73, and the like) are omitted for simplicity.

The transistor illustrated in FIGS. 7A and 7B includes a first oxide insulating film 53 over a substrate 51, a second oxide insulating film 55 in the periphery of the first oxide insulating film 53, an oxide semiconductor film 64 over the first oxide insulating film 53 and the second oxide insulating film 55, a pair of electrodes 68 and 70 in contact with the oxide semiconductor film 64 and serving as a source electrode and a drain electrode, the gate insulating film 59 in contact with at least part of the oxide semiconductor film 64, and a gate electrode 61 over the gate insulating film 59 and overlapping with the oxide semiconductor film 63. The sidewall insulating films 65 in contact with side surfaces of the gate electrode 61 may be provided. The oxide semiconductor film 64 includes a first region 64a overlapping with the gate electrode 61 and a pair of second regions 64b and 64c containing dopant between which the first region 63a is sandwiched. In addition, the insulating film 71 covering the first oxide insulating film 53, the second oxide insulating film 55, the gate electrode 61, the sidewall insulating films 65, and the pair of electrodes 68 and 70 is provided. Moreover, the insulating film 73 covering the insulating film 71 is provided. Further, in openings provided in the insulating films 71 and 73, a pair of wirings 81 and 83 connected to the pair of electrodes 68 and 70 are provided.

For the pair of electrodes 68 and 70 and wirings 81 and 83, a material and a structure similar to those of the pair of electrodes 67 and 69 in Embodiment 1 can be used as appropriate. One of the wirings 81 and 83 also serves as a signal line, and wiring resistance can be reduced by forming the wirings 81 and 83 using aluminum, copper, or the like which is a low-resistance material.

The transistor illustrated in FIGS. 7A and 7B can be manufactured by, after the steps in Embodiment 2, forming openings through etching of part of the insulating film 71 and part of the insulating film 73 and forming the wirings 81 and 83 in the openings. In addition, in the transistor illustrated in FIGS. 7A and 7B, the pair of electrodes 68 and 70 are formed over the oxide semiconductor film 64. Therefore, over-etching of the oxide semiconductor film 64 can be suppressed in etching of the insulating films 71 and 73 (in forming of the openings), whereby the transistor can be manufactured at a high yield, and the amount of current flowing through the oxide semiconductor film 64 can be increased.

In addition, in accordance with this embodiment, a negative shift of the threshold voltage of the transistor can be reduced, and in addition, electric characteristics of the transistor can be improved.

The structures, methods, and the like described in this embodiment can be combined as appropriate with any of the structures, methods, and the like described in the other embodiments.

(Embodiment 4)

In this embodiment, the case where the oxide semiconductor films 63 and 64 described in Embodiments 1 to 3 are each a CAAC-OS film will be described.

A first method for forming the oxide semiconductor films 63 and 64 each of which is a CAAC-OS film is described below.

In order to form the oxide semiconductor films 63 and 64 each of which is a CAAC-OS film, in the case where the oxide semiconductor film to be the oxide semiconductor film 57 described in Embodiment 1 (see FIGS. 3I and 3J) is formed by a sputtering method for example, the substrate temperature is set to be higher than or equal to 150° C. and lower than or equal to 750° C., preferably higher than or equal to 150° C. and lower than or equal to 450° C., more preferably higher than or equal to 200° C. and lower than or equal to 350° C. In such a manner, a CAAC-OS film can be formed while entry of moisture (including hydrogen) or the like into the oxide semiconductor film is reduced.

The oxide semiconductor film is formed by the above method and part of it is etched, so that the oxide semiconductor film 57 having a predetermined shape is formed.

Then, the insulating film 58 is formed as illustrated in FIGS. 4A and 4B and heating is performed. In this way, hydrogen can be released from the oxide semiconductor film 57, and part of oxygen contained in the first oxide insulating film 53 can be diffused to the oxide semiconductor film 57 and the vicinity of the interface between the first oxide insulating film 53 and the oxide semiconductor film 57, and part of oxygen contained in the insulating film 58 is diffused to the side surface of the oxide semiconductor film which crosses the channel width direction. By this heat treatment, the oxide semiconductor film 60 which is a CAAC-OS film with higher crystallinity can be formed. After that, through the steps illustrated in FIGS. 4E to 4H, the oxide semiconductor films 63 and 64 can be formed.

Next, a second method for forming the oxide semiconductor films 63 and 64 each of which is a CAAC-OS film is described.

A first oxide semiconductor film is formed over the first oxide insulating film 53 and the second oxide insulating film 55. The thickness of the first oxide semiconductor film is greater than or equal to a thickness of one atomic layer and less than or equal to 10 nm, preferably greater than or equal to 2 nm and less than or equal to 5 nm.

When the first oxide semiconductor film is formed, the substrate temperature is set to be higher than or equal to 150° C. and lower than or equal to 750° C., preferably higher than or equal to 150° C. and lower than or equal to 450° C., more preferably higher than or equal to 200° C. and lower than or equal to 350° C. In such a manner, entry of an impurity such as moisture (including hydrogen) to be contained in the first oxide semiconductor film can be reduced. Further, crystallinity of the first oxide semiconductor film can be improved; accordingly, a CAAC-OS film with high orientation can be formed.

After the first oxide semiconductor film is formed, first heat treatment may be performed. By the first heat treatment, moisture (including hydrogen) can be further released from the first oxide semiconductor film; accordingly, crystallinity can be further increased. By the first heat treatment, a CAAC-OS film with high orientation can be formed. The first heat treatment is performed at a temperature of higher than or equal to 150° C. and lower than the strain point of the substrate, preferably higher than or equal to 250° C. and lower than or equal to 450° C., more preferably higher than or equal to 300° C. and lower than or equal to 450° C.

For the first heat treatment, a rapid thermal annealing (RTA) apparatus can be used. With the use of the RTA, only in a short time, the heat treatment can be performed at a temperature of higher than or equal to the strain point of the substrate. Therefore, time to form an oxide semiconductor film in which the proportion of a crystalline region is higher than that of an amorphous region can be shortened.

The first heat treatment can be performed in an inert gas atmosphere; preferably, in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is from 3 minutes to 24 hours. As the treatment time is increased, the proportion of a crystal region with respect to that of an amorphous region in the oxide semiconductor film can be increased. Note that heat treatment for longer than 24 hours is not preferable because the productivity is low.

Next, a second oxide semiconductor film is formed over the first oxide semiconductor film. The second oxide semiconductor film can be formed by a method similar to that for the first oxide semiconductor film.

When the substrate is heated while the second oxide semiconductor film is formed, the second oxide semiconductor film can be crystallized with the use of the first oxide semiconductor film as a seed crystal. At this time, the formation of the first oxide semiconductor film and the second oxide semiconductor film both including the same element is referred to as "homoepitaxial growth". The formation of the first oxide semiconductor film and the second oxide semiconductor film including at least one different element from each other is referred to as "heteroepitaxial growth".

After formation of the second oxide semiconductor film, second heat treatment may be performed. The second heat treatment may be performed in a manner similar to that of the first heat treatment. With the second heat treatment, moisture (including hydrogen) contained in the first oxide semiconductor film or the second oxide semiconductor film can be released, so that an oxide semiconductor film in which the proportion of a crystalline region with respect to an amorphous region is high can be obtained. Alternatively, with the second heat treatment, the second oxide semiconductor film can be crystallized using the first oxide semiconductor film as a seed crystal.

Through the above method, the oxide semiconductor film which is a CAAC-OS film can be formed while entry of hydrogen or the like into the oxide semiconductor film is reduced. In addition, part of the oxide semiconductor film is etched, so that the oxide semiconductor film 57 having a predetermined shape can be formed. As illustrated in FIGS. 4A and 4B, by heat treatment after the insulating film 58 is formed, more hydrogen can be released from the oxide semiconductor film 57, and part of oxygen contained in the first oxide insulating film 53 can be diffused to the oxide semiconductor film 57, the vicinity of the interface between the first oxide insulating film and the oxide semiconductor film 57, and part of oxygen contained in the insulating film 58 is diffused to the side surface of the oxide semiconductor film which crosses the channel width direction. By this heat treatment, the oxide semiconductor film 60 which is a CAAC-OS film with higher crystallinity can be formed. After that, through the steps illustrated in FIGS. 4E to 4H, the oxide semiconductor films 63 and 64 can be formed.

Hydrogen contained in the oxide semiconductor is reacted with oxygen bonded to a metal atom to be water, and in addition, a vacancy is formed in a lattice from which oxygen is removed (or a portion from which oxygen is removed). Thus, impurities are reduced as much as possible in the formation step of the oxide semiconductor film, whereby vacancies in the oxide semiconductor film can be reduced. Therefore, by using an oxide semiconductor film which is a CAAC-OS film that is highly purified through removal of the impurities as much as possible for a channel region, the amount of change in threshold voltage of the transistor before and after light irradiation or the BT stress test is small, whereby the transistor can have stable electric characteristics.

In order to reduce grain boundaries in the CAAC-OS film, planarity of the first oxide insulating film 53 and the second oxide insulating film 55 each which serve as a base insulating film of the oxide semiconductor film is preferably improved. Typically, an average surface roughness ($R_a$) of the first oxide insulating film 53 and an average surface roughness of the second oxide insulating film 55 are each preferably greater than or equal to 0.1 nm and less than 0.5 nm. In this specification and the like, as the average surface roughness ($R_a$), a center line average roughness ($R_a$) which is defined in JISB0601:2001 (ISO 4287:1997) is used.

Crystals included in the oxide semiconductor film grow in the direction substantially perpendicular to the surface of the base insulating film; thus, by increasing the level of planarity of the base insulating film, the growth directions of crystals can be substantially uniform. When such crystals are arranged in a layered manner, crystal boundaries can be reduced.

The structures, methods, and the like described in this embodiment can be combined as appropriate with any of the structures, methods, and the like described in the other embodiments.

(Embodiment 5)

In this embodiment, as an example of a semiconductor device formed by the method for manufacturing a semiconductor device, which is described in any of the above embodiments, a storage medium (a memory element) will be described. In particular, in this embodiment, a memory element in which a transistor including an oxide semiconductor manufactured by the manufacturing method described in any of the above embodiments and a transistor including a material other than an oxide semiconductor are formed over one substrate will be described.

Figure 8A:
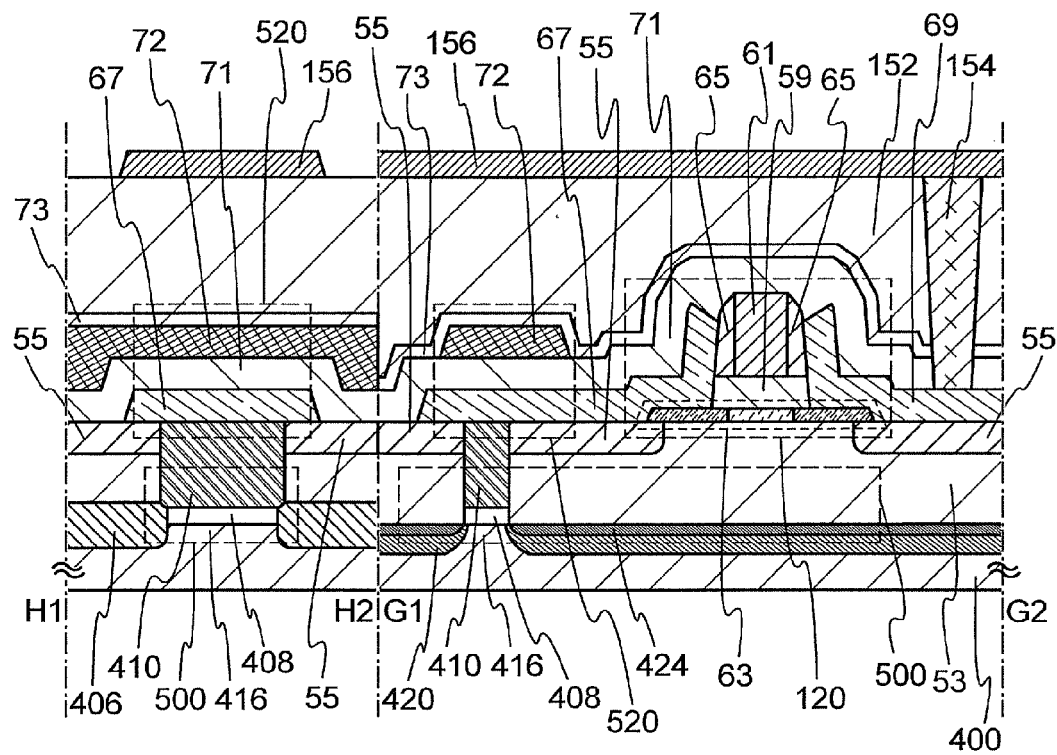
FIGS. 8A to 8C are a cross-sectional view, a top view, and a circuit diagram each illustrating a semiconductor device according to an embodiment of the present invention.
Figure 8B:
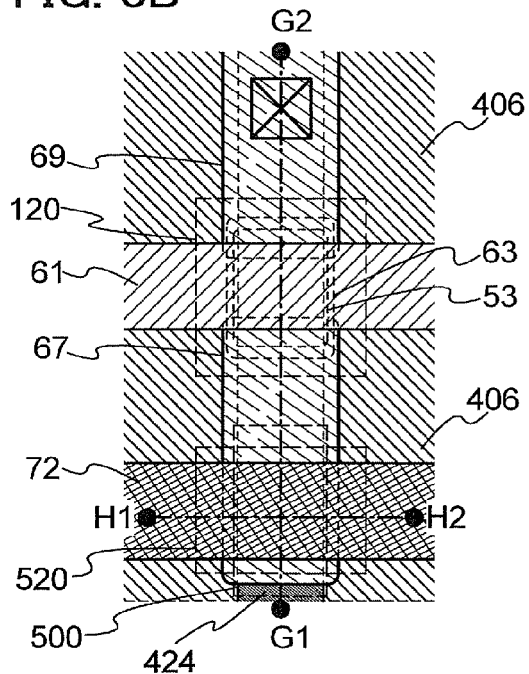
Figure 8C:
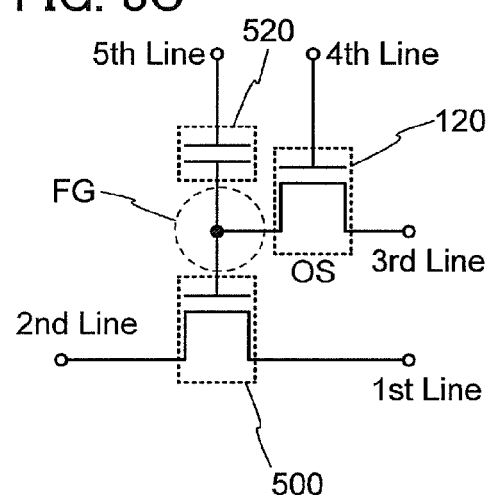

FIGS. 8A to 8C illustrate an example of a structure of a memory element described in this embodiment. FIG. 8A is a cross-section view of the memory element and FIG. 8B is a top view of the memory element. Here, FIG. 8A corresponds to a cross section taken along lines G1-G2 and H1-H2 of FIG. 8B. FIG. 8C is a circuit diagram of the memory element. Note that in FIG. 8B, the first oxide insulating film 53 and the second oxide insulating film 55 described later are not illustrated for simplicity.

In the memory element illustrated in FIGS. 8A and 8B, a transistor 500 including a first semiconductor material is provided in a lower portion, and a transistor 120 an example of which is described in any of the above embodiments is provided in an upper portion. In this embodiment, the first semiconductor material is a semiconductor material other than an oxide semiconductor. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material other than an oxide semiconductor can operate at high speed easily. Note that the transistor 120 includes an oxide semiconductor as a second semiconductor material. The transistor described in any of the above embodiments can be used as the transistor 120. The off-state current of the transistor including an oxide semiconductor as described above is very small, and electric charge can be held for a long time owing to the very small off-state current.

A cross section of the transistor 500 which is along line G1-G2 (see FIG. 8B) includes a channel formation region 416 provided in a substrate 400 including a semiconductor material that can be used as the first semiconductor material; impurity regions 420 provided so that the channel formation region 416 is sandwiched therebetween; metal compound regions 424 in contact with the impurity regions 420; a gate insulating film 408 provided over the channel formation region 416; and a gate electrode 410 provided over the gate insulating film 408.

The substrate 400 may include a semiconductor material that can be used as the first semiconductor material. For example, a single crystal semiconductor substrate or a polycrystalline semiconductor substrate made of silicon, silicon carbide, or the like; a compound semiconductor substrate made of silicon germanium or the like; an SOI substrate; or the like can be used. Moreover, an SOI substrate can be a substrate in which a semiconductor film is provided over an insulating substrate such as a glass substrate with an insulating layer interposed therebetween.

An element isolation insulating layer 406 is provided on the substrate 400 so as to surround the transistor 500 (see FIGS. 8A and 8B). Note that for higher integration, it is preferable that, as illustrated in FIG. 8A, the transistor 500 do not have a sidewall insulating film. On the other hand, in the case where the characteristics of the transistor 500 have priority, sidewall insulating films may be provided on side surfaces of the gate electrode 410, and the impurity regions 420 may include regions with different impurity concentrations.

The transistor 500 including the first semiconductor material can be operated at high speed. By using the transistor 500 as a reading transistor, data can be read at high speed.

Then, the transistor 120 provided over the transistor 500 is described with reference to FIG. 8A. As described above, since the transistor described in any of the above embodiments can be applied to the transistor 120, the same reference numerals as in the above embodiments are used for describing the transistor 120. A first oxide insulating film 53 and a second oxide insulating film 55 are provided over the transistor 500. The first oxide insulating film 53 and the second oxide insulating film 55 each serve as an interlayer insulating film between the transistor 500 and the transistor 120. Thus, the total thickness of the first oxide insulating film 53 and the second oxide insulating film 55 is preferably set such that parasitic capacitance is not generated between the transistor 500 and the transistor 120. The first oxide insulating film 53, the second oxide insulating film 55, and the gate electrode 410 of the transistor 500 are processed to have a high degree of planarity. An oxide semiconductor film 63 is formed on and in contact with the first oxide insulating film 53 and the second oxide insulating film 55. The description in the above embodiments can be referred to for the details and the manufacturing methods of the first oxide insulating film 53, the second oxide insulating film 55, and the oxide semiconductor film 63.

A gate insulating film 59 and a gate electrode 61 are formed in contact with each other over the oxide semiconductor film 63, and sidewall insulating films 65 are provided such that the gate electrode 61 is sandwiched therebetween. Of a pair of electrodes 67 and 69, the electrode 67 which serves as a source electrode of the transistor 120 is provided in contact with the oxide semiconductor film 63, the gate insulating film 59, one of the sidewall insulating films 65, and the gate electrode 410 of the transistor 500. Of the pair of electrodes 67 and 69, the electrode 69 which serves as a drain electrode of the transistor 120 is provided to be in contact with the oxide semiconductor film 63, the gate insulating film 59, and the other of the sidewall insulating films 65. Of the pair of electrodes 67 and 69, the electrode 67 may serve as a drain electrode, and the electrode 69 may serve as a drain electrode. The description in the above embodiments can be referred to for the details and the manufacturing methods of the gate insulating film 59, the gate electrode 61, and the pair of electrodes 67 and 69.

The electrode 67 which serves as the source electrode of the transistor 120 is provided in contact with the gate electrode 410 of the transistor 500, so that the transistor 500 and the transistor 120 are electrically connected to each other.

When the oxide semiconductor film 63 included in the transistor 120 is a CAAC-OS film, defects such as oxygen vacancies or impurities such as hydrogen can be reduced in the oxide semiconductor film 63. In that case, the oxide semiconductor film 63 is electrically stable against irradiation with visible light or ultraviolet light. That is, the transistor 120 including the oxide semiconductor film 63 has stable electric characteristics; thus, by using the transistor 120, a highly reliable memory element which has stable electric characteristics can be provided.

An insulating film 71 is provided over the second oxide insulating film 55, the sidewall insulating films 65, and the pair of electrodes 67 and 69, and a wiring 72 is provided so as to overlap with the electrode 67 serving as the source electrode of the transistor 120. In this way, a capacitor 520 is constituted by the electrode 67 serving as the source electrode of the transistor 120, the insulating film 71, and the wiring 72. In the case where a capacitor is not needed, it is possible to employ a structure without the capacitor 520. In addition, as illustrated in FIG. 8A, an insulating film 73 may be provided as a protective film over the wiring 72. The description in the above embodiments can be referred to for the details of the insulating film 71 and the insulating film 73. The wiring 72 is formed in such a manner that a conductive film is formed using a material that can be used for the gate electrode 61 and the pair of electrodes 67 and 69 of the transistor 120 and selectively etched.

Over the insulating film 73, an insulating film 152 serving as an interlayer insulating film between a wiring 156 described later and the transistor 120 and between the wiring 156 and the capacitor 520 is formed. The insulating film 152 can be formed by a PVD method such as a sputtering method, a CVD method such as a plasma CVD method, or the like. The insulating film 152 can be formed using a material including an inorganic insulating material such as silicon oxide, silicon oxynitride, silicon nitride, aluminum oxide, or gallium oxide.

The wiring 156 is formed over the insulating film 152. The wiring 156 is electrically connected to the electrode 69 serving as the drain electrode of the transistor 120 through an electrode 154 formed in an opening provided in the insulating film 71, the insulating film 73, and the insulating film 152.

The electrode 154 can be formed in such a manner, for example, that a conductive film is formed in a region including the opening by a PVD method such as a sputtering method, a CVD method such as a plasma CVD method, or the like and then part of the conductive film is removed by etching treatment, CMP, or the like. The electrode 154 can be formed using a material that can be used for the gate electrode 61 and the pair of electrodes 67 and 69 of the transistor 120.

The wiring 156 is formed by forming a conductive film by a PVD method or a CVD method, and then by selectively etching the conductive film as in the case of the electrode 154. The wiring 156 can be formed using a material that can be used for the gate electrode 61 and the pair of electrodes 67 and 69 of the transistor 120.

The transistor 500 overlaps with the transistor 120 in the memory element described in this embodiment, whereby the degree of integration of the transistors can be increased without increasing the area occupied by the transistors in the memory element. By using the memory element, a semiconductor device such as a memory element array with a high degree of integration can be achieved.

FIG. 8C is a circuit diagram of the memory element illustrated in FIGS. 8A and 8B. In FIG. 8C, one of the source electrode and the drain electrode of the transistor 120, one electrode of the capacitor 520, and the gate electrode of the transistor 500 are electrically connected to each other. A first wiring (a 1st line, also referred to as a source line) is electrically connected to a source electrode of the transistor 500. A second wiring (a 2nd line, also referred to as a bit line) is electrically connected to a drain electrode of the transistor 500. A third wiring (3rd line, also referred to as a first signal line) is electrically connected to the other of the source electrode and the drain electrode of the transistor 120. A fourth wiring (4th line, also referred to as a second signal line) is electrically connected to the gate electrode of the transistor 120. A fifth wiring (a 5th line, also referred to as a word line) is electrically connected to the other electrode of the capacitor 520. In this embodiment, "OS" is written beside a transistor to which the transistor described in any of the above embodiments can be applied in the drawing.

The transistor 120 including an oxide semiconductor has an extremely small off-state current; therefore, when the transistor 120 is off, the potential of a node (hereinafter, a node FG) where one of the source electrode and the drain electrode of the transistor 120, one electrode of the capacitor 520, and the gate electrode of the transistor 500 are electrically connected to each other can be held for an extremely long time. Providing the capacitor 520 facilitates holding of electric charge supplied to the node FG and reading of stored data.

When data is stored in the semiconductor device (writing), the potential of the fourth wiring is set to a potential at which the transistor 120 is turned on, whereby the transistor 120 is turned on. Thus, the potential of the third wiring is supplied to the node FG and a predetermined amount of electric charge is accumulated in the node FG Here, electric charge for applying either of two different potential levels (hereinafter referred to as low-level electric charge and high-level electric charge) is supplied to the node FG After that, the potential of the fourth wiring is set to a potential at which the transistor 120 is turned off, whereby the transistor 120 is turned off. This makes the node FG floating and the predetermined amount of electric charge is held in the node FG The predetermined amount of electric charge is thus accumulated and held in the node FG, whereby the memory element can store data.

Since the off-state current of the transistor 120 is extremely small, the electric charge supplied to the node FG is held for a long time. This can remove the need of refresh operation or drastically reduce the frequency of the refresh operations, which leads to a sufficient reduction in power consumption. Moreover, stored data can be held for a long time even when power is not supplied.

When stored data is read out (reading), while a predetermined potential (a fixed potential) is supplied to the first wiring, an appropriate potential (a read-out potential) is supplied to the fifth wiring, whereby the transistor 500 changes its state depending on the amount of electric charge held in the node FG This is because, in general, when the transistor 500 is an n-channel transistor, an apparent threshold voltage $V_{th\_H}$ of the transistor 500 in the case where a high-level electric charge is held in the node FG is lower than an apparent threshold voltage $V_{th\_L}$ of the transistor 500 in the case where a low-level electric charge is held in the node FG. Here, an apparent threshold voltage refers to the potential of the fifth wiring which is needed to turn on the transistor 500. Thus, by setting the potential of the fifth wiring to a potential $V_0$ which is between $V_{th\_H}$ and $V_{th\_L}$, electric charge held in the node FG can be determined. For example, in the case where a high-level electric charge is applied in writing, the transistor 500 is turned on when the potential of the fifth wiring is set to $V_0(>V_{th\_H})$. In the case where a low-level electric charge is given in writing, even when the potential of the fifth wiring is set to $V_0 (< V_{th\_L})$, the transistor 500 remains in an off state. In such a manner, by controlling the potential of the fifth wiring and determining whether the transistor 500 is on or off (reading out the potential of the second wiring), stored data can be read out.

Further, in order to rewrite stored data, a new potential is supplied to the node FG that is holding the predetermined amount of electric charge given in the above writing, so that the electric charge of the new data is held in the node FG. Specifically, the potential of the fourth wiring is set to a potential at which the transistor 120 is turned on, whereby the transistor 120 is turned on. The potential of the third wiring (a potential of new data) is supplied to the node FG, and the predetermined amount of electric charge is accumulated in the node FG After that, the potential of the fourth wiring is set to a potential at which the transistor 120 is turned off, whereby the transistor 120 is turned off. Thus, electric charge of the new data is held in the node FG In other words, while the predetermined amount of electric charge given in the first writing is held in the node FG, the same operation (a second writing) as in the first writing is performed, whereby the stored data can be overwritten.

The off-state current of the transistor 120 described in this embodiment can be sufficiently reduced by using the highly purified oxide semiconductor film 63. Further, the oxide semiconductor film 63 that is formed on and in contact with the first oxide insulating film 53 and the second oxide insulating film 55 which are highly planarized is not only highly purified but also is a CAAC-OS film, so that the transistor 120 having stable electric characteristics and high reliability can be formed. Further, with the use of such a transistor 120, a highly reliable memory element capable of holding stored data for an extremely long time can be obtained.

The structures, methods, and the like described in this embodiment can be combined as appropriate with any of the structures, methods, and the like described in the other embodiments.

(Embodiment 6)

In this embodiment, application examples of a semiconductor device including the transistor described in any of the above embodiments will be described with reference to FIGS. 9A and 9B.

Figure 9A:
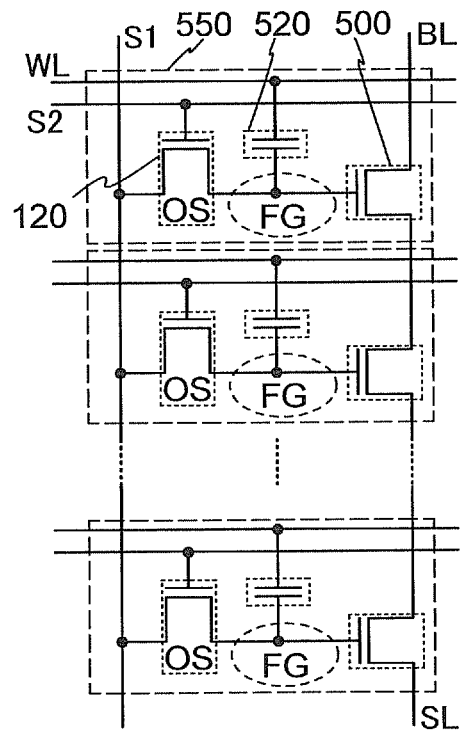
FIGS. 9A and 9B are circuit diagrams each illustrating a semiconductor device according to an embodiment of the present invention.
Figure 9B:
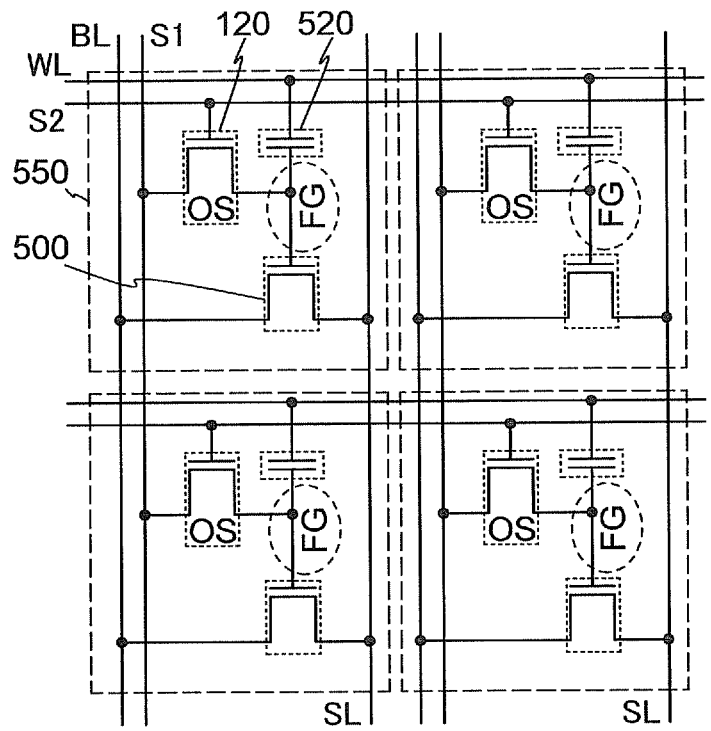

FIGS. 9A and 9B are circuit diagrams of semiconductor devices each including a plurality of memory elements (hereinafter also referred to as memory cells 550) illustrated in FIGS. 8A to 8C. FIG. 9A is a circuit diagram of a so-called NAND semiconductor device in which the memory cells 550 are connected in series, and FIG. 9B is a circuit diagram of a so-called NOR semiconductor device in which the memory cells 550 are connected in parallel. In this embodiment, "OS" is written beside a transistor to which the transistor described in any of the above embodiments can be applied in the drawing.

The semiconductor device in FIG. 9A includes a source line SL, a bit line BL, a first signal line S1, a plurality of second signal lines S2, a plurality of word lines WL, and the plurality of memory cells 550. In FIG. 9A, one source line SL and one bit line BL are provided in the semiconductor device; however, this embodiment is not limited to this structure. A plurality of source lines SL and a plurality of bit lines BL may be provided.

In each of the memory cells 550, a gate electrode of a transistor 500, one of a source electrode and a drain electrode of a transistor 120, and one electrode of a capacitor 520 are electrically connected to each other. The first signal line S1 and the other of the source electrode and the drain electrode of the transistor 120 are electrically connected to each other, and the second signal line S2 and a gate electrode of the transistor 120 are electrically connected to each other. The word line WL and the other electrode of the capacitor 520 are electrically connected to each other.

Further, the source electrode of the transistor 500 included in the memory cell 550 is electrically connected to a drain electrode of a transistor 500 in the adjacent memory cell 550. The drain electrode of the transistor 500 included in the memory cell 550 is electrically connected to a source electrode of a transistor 500 in the adjacent memory cell 550. Note that a drain electrode of a transistor 500 included in a memory cell 550 of the plurality of memory cells connected in series, which is provided at one end, is electrically connected to the bit line. In addition, a source electrode of a transistor 500 included in a memory cell 550 of the plurality of memory cells connected in series, which is provided at the other end, is electrically connected to the source line.

In the semiconductor device illustrated in FIG. 9A, writing operation and reading operation are performed per row. The writing operation is performed as follows. Potential at which the transistor 120 is turned on is supplied to the second signal line S2 in a row where writing is performed, so that the transistor 120 in the row where writing is performed is turned on. Accordingly, a potential of the first signal line S1 is supplied to the gate electrode of the transistor 500 of the specified row, so that a predetermined electric charge is given to the gate electrode. Thus, data can be written to the memory cell of the specified row.

Further, the reading operation is performed as follows. First, a potential at which the transistor 500 is turned on regardless of electric charge given to the gate electrode of the transistor 500 is supplied to the word lines WL of the rows other than the row where reading is to be performed, so that the transistors 500 of the rows other than the row where reading is to be performed are turned on. Then, a potential (reading potential) at which an on state or an off state of the transistor 500 is determined depending on electric charge in the gate electrode of the transistor 500 is supplied to the word line WL of the row where reading is to be performed. After that, a constant potential is supplied to the source line SL so that a reading circuit (not illustrated) connected to the bit line BL is operated. Here, the plurality of transistors 500 between the source line SL and the bit line BL are on except the transistors 500 of the row where reading is to be performed; therefore, conductance between the source line SL and the bit line BL is determined by a state (an on state or an off state) of the transistors 500 of the row where reading is to be performed. The conductance of the transistor 500 in the row on which reading is performed depends on electric charge in the gate electrode of the transistor 500. Thus, a potential of the bit line BL varies accordingly. By reading the potential of the bit line BL with the reading circuit, data can be read out from the memory cell of the specified row.

The semiconductor device in FIG. 9B includes a plurality of source lines SL, a plurality of bit lines BL, a plurality of first signal lines S1, a plurality of second signal lines S2, a plurality of word lines WL, and a plurality of the memory cells 550. A gate electrode of a transistor 500, one of a source electrode and a drain electrode of a transistor 120, and one electrode of a capacitor 520 are electrically connected to each other. The source line SL and a source electrode of the transistor 500 are electrically connected to each other. The bit line BL and a drain electrode of the transistor 500 are electrically connected to each other. The first signal line S1 and the other of the source electrode and the drain electrode of the transistor 120 are electrically connected to each other, and the second signal line S2 and a gate electrode of the transistor 120 are electrically connected to each other. The word line WL and the other electrode of the capacitor 520 are electrically connected to each other.

In the semiconductor device in FIG. 9B, writing operation and reading operation are performed per row. The writing operation is performed in a manner similar to that of the semiconductor device in FIG. 9A. The reading operation is performed as follows. First, a potential at which the transistor 500 is turned off regardless of electric charge given to the gate electrode of the transistor 500 is supplied to the word lines WL of the rows other than the row where reading is to be performed, so that the transistors 500 of the rows other than the row where reading is to be performed are turned off. Then, a potential (reading potential) at which an on state or an off state of the transistor 500 is determined depending on electric charge in the gate electrode of the transistor 500 is supplied to the word line WL of the row where reading is to be performed. After that, a constant potential is supplied to the source line SL so that a reading circuit (not illustrated) connected to the bit line BL is operated. Here, conductance between the source lines SL and the bit lines BL is determined by a state (an on state or an off state) of the transistors 500 of the row where reading is to be performed. That is, a potential of the bit lines BL depends on electric charge in the gate electrodes of the transistors 500 of the row where reading is to be performed. By reading the potential of the bit line BL with the reading circuit, data can be read out from the memory cells of the specified row.

Although the amount of data which can be held in each of the memory cells 550 is one bit in the above description, the structure of the semiconductor device of this embodiment is not limited to this. The amount of data which is held in each of the memory cells 550 may be increased by preparing three or more potentials to be supplied to the gate electrode of the transistor 500. For example, in the case where the number of kinds of potentials to be supplied to the gate electrode of the transistor 500 is four, data of two bits can be held in each of the memory cells.

The structures, methods, and the like described in this embodiment can be combined with the structures, methods, and the like described in the other embodiments as appropriate.

(Embodiment 7)

In this embodiment, examples of a semiconductor device including the transistor described in any of the above embodiments will be described with reference to FIGS. 10A and 10B.

Figure 10A:
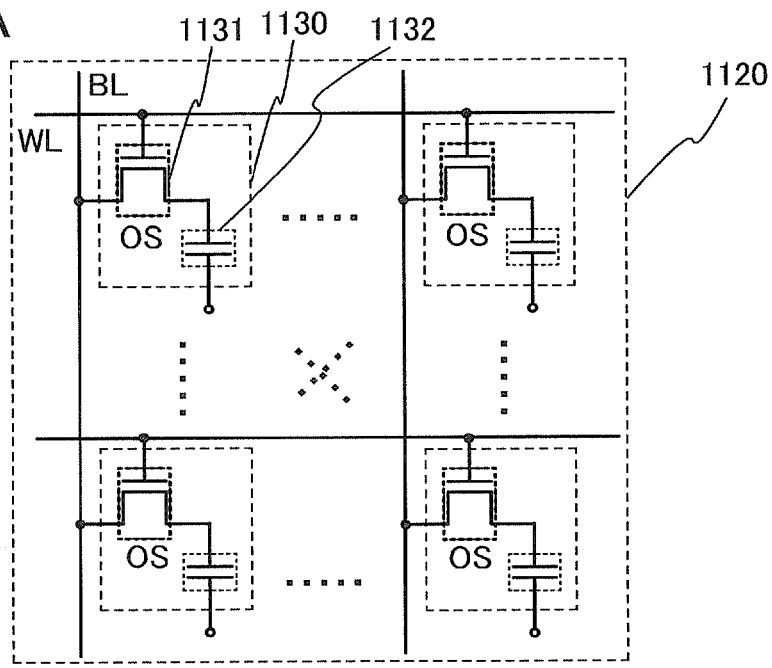
FIGS. 10A and 10B are circuit diagrams each illustrating a semiconductor device according to an embodiment of the present invention.

In FIG. 10A, an example of a semiconductor device having a structure corresponding to a so-called dynamic random access memory (DRAM) is illustrated. A memory cell array 1120 illustrated in FIG. 10A has a structure in which a plurality of memory cells 1130 are arranged in a matrix. Further, the memory cell array 1120 includes m first wirings and n second wirings. Note that in this embodiment, the first wiring and the second wiring are referred to as a bit line BL and a word line WL, respectively.

The memory cell 1130 includes a transistor 1131 and a capacitor 1132. A gate electrode of the transistor 1131 is connected to the first wiring (the word line WL). Further, one of a source electrode and a drain electrode of the transistor 1131 is connected to the second wiring (the bit line BL). The other of the source electrode and the drain electrode of the transistor 1131 is connected to one electrode of the capacitor. The other electrode of the capacitor is connected to a capacitor line CL and is supplied with a predetermined potential. The transistor described in any of the above embodiments is applied to the transistor 1131. In this embodiment, "OS" is written beside a transistor to which the transistor described in any of the above embodiments can be applied in the drawing.

The off-state current of the transistor described in any of the above embodiments can be sufficiently reduced by using a highly purified oxide semiconductor film. Further, when an oxide semiconductor film which is a CAAC-OS film is formed on and in contact with an insulating film whose surface roughness is reduced, the oxide semiconductor film can have stable electric conductivity. By using such an oxide semiconductor film for the transistor, a highly reliable transistor having stable electric characteristics can be provided. Further, with the use of such a transistor, the semiconductor device in FIG. 10A, which is regarded as a so-called DRAM, can substantially be used as a nonvolatile memory.

Figure 10B:
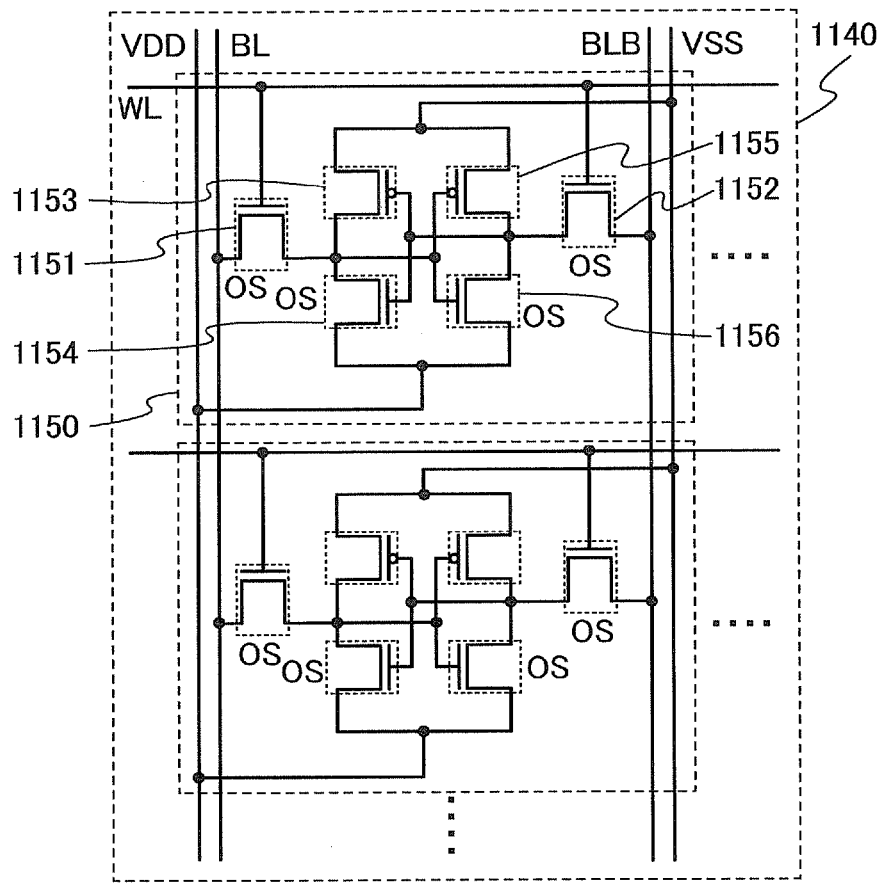

In FIG. 10B, an example of a semiconductor device having a structure corresponding to a so-called static random access memory (SRAM) is illustrated. A memory cell array 1140 illustrated in FIG. 10B can have a structure in which a plurality of memory cells 1150 are arranged in a matrix. Further, the memory cell array 1140 includes a first wiring (word line WL), a second wiring (a bit line BL), a third wiring (an inverted bit line BLB), a power supply line VDD, and a ground potential line VSS.

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 serve as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors, and the transistor described in any of the above embodiments can be applied to these transistors. Each of the third transistor 1153 and the fifth transistor 1155 is a p-channel transistor in which a channel formation region is formed using a material other than an oxide semiconductor (e.g., single crystal silicon).

The structures, methods, and the like described in this embodiment can be combined with the structures, methods, and the like described in any of the other embodiments as appropriate.

(Embodiment 8)

A central processing unit (CPU) can be formed using a transistor in which a channel formation region is formed using an oxide semiconductor for at least part of the CPU.

Figure 11A:
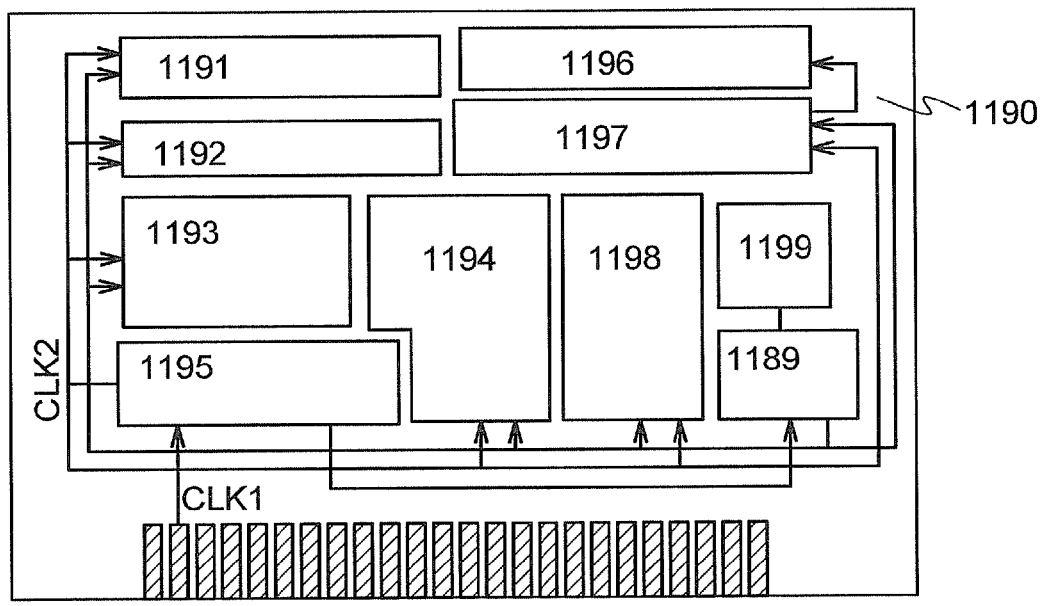
FIGS. 11A to 11C each illustrate a semiconductor device according to an embodiment of the present invention.

FIG. 11A is a block diagram illustrating a specific structure of a CPU. The CPU illustrated in FIG. 11A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Obviously, the CPU illustrated in FIG. 11A is just an example in which the structure is simplified, and an actual CPU may have various structures depending on the application.

An instruction that is input to the CPU through the Bus I/F 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 11A, a memory element is provided in the register 1196. The memory element described in any of Embodiments 5 to 7 can be used as the memory element provided in the register 1196.

In the CPU illustrated in FIG. 11A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 11B:
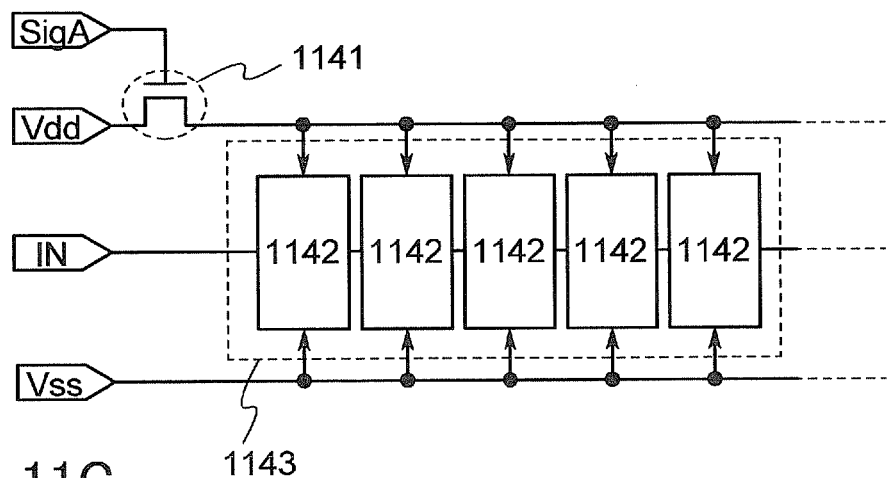
Figure 11C:
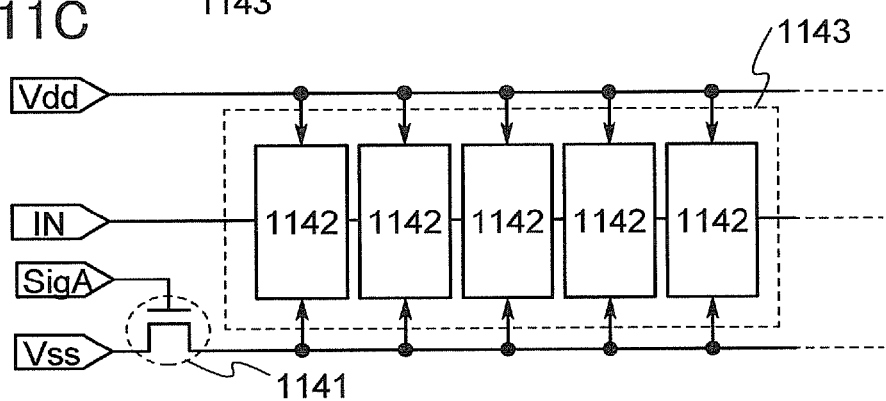

The power supply can be stopped by providing a switching element between a memory element group and a node to which a power supply potential Vdd or a power supply potential Vss is supplied, as illustrated in FIG. 11B or FIG. 11C. Circuits illustrated in FIGS. 11B and 11C are described below.

FIGS. 11B and 11C each illustrate an example of a structure of a memory circuit including a transistor in which a channel formation region is formed using an oxide semiconductor as a switching element for controlling supply of a power supply potential to a memory element.

The memory device illustrated in FIG. 11B includes a switching element 1141 and a memory element group 1143 including a plurality of memory elements 1142. Specifically, as each of the memory elements 1142, the memory element described in any of Embodiments 5 to 7 can be used. Each of the memory elements 1142 included in the memory element group 1143 is supplied with the high-level power supply potential Vdd via the switching element 1141. Further, each of the memory elements 1142 included in the memory element group 1143 is supplied with a potential of a signal IN and the low-level power supply potential Vss.

In FIG. 11B, a transistor in which a channel formation region is formed using an oxide semiconductor is used for the switching element 1141, and the switching of the transistor is controlled by a signal Sig A supplied to a gate electrode thereof.

Note that FIG. 11B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential Vdd to each of the memory elements 1142 included in the memory element group 1143 in FIG. 11B, the switching element 1141 may control the supply of the low-level power supply potential Vss.

In FIG. 11C, an example of a memory device in which each of the memory elements 1142 included in the memory element group 1143 is supplied with the low-level power supply potential Vss via the switching element 1141 is illustrated. The supply of the low-level power supply potential Vss to each of the memory elements 1142 included in the memory element group 1143 can be controlled by the switching element 1141.

When a switching element is provided between a memory element group and a node to which the power supply potential Vdd or the power supply potential Vss is supplied, data can be held even in the case where an operation of a CPU is temporarily stopped and the supply of the power supply voltage is temporarily stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The structures, methods, and the like described in this embodiment can be combined with the structures, methods, and the like described in any of the other embodiments as appropriate.

(Embodiment 9)

In this embodiment, an example in which at least part of a driving circuit and a transistor to be disposed in a pixel portion are formed over one substrate will be described below.

The transistor of the pixel portion is formed by the method described in any of the above embodiments. Further, the transistor can easily be an n-channel transistor, and thus, part of a driving circuit that can be formed using an n-channel TFT can be formed over the same substrate as the transistor of the pixel portion. By using the transistor described in any of the above embodiments for the pixel portion or the driving circuit as described above, a highly reliable display device can be provided.

Figure 12A:
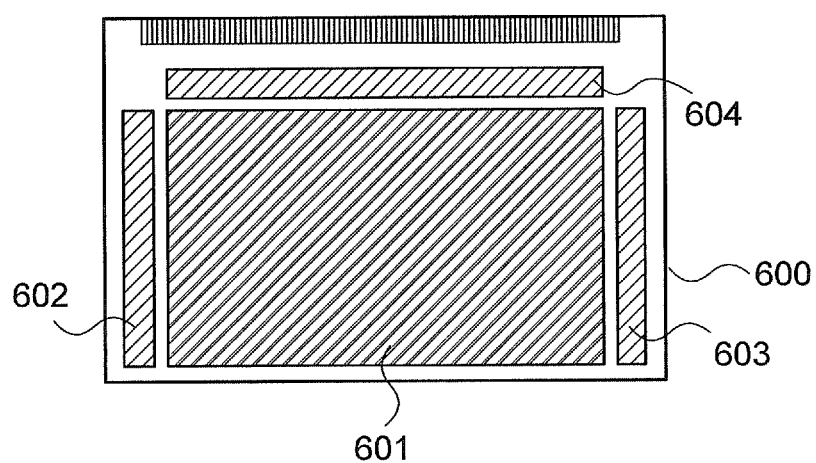
FIGS. 12A to 12C are a top view and circuit diagrams each illustrating an active matrix display device according to an embodiment of the present invention.

FIG. 12A illustrates an example of an active matrix display device. A pixel portion 601, a first scan line driving circuit 602, a second scan line driving circuit 603, and a signal line driving circuit 604 are provided over a substrate 600 in the display device. In the pixel portion 601, a plurality of signal lines extended from the signal line driving circuit 604 are arranged and a plurality of scan lines extended from the first scan line driving circuit 602 and the second scan line driving circuit 603 are arranged. Note that pixels which include display elements are arranged in matrix in regions where the scan lines and the signal lines are crossed. Further, the substrate 600 of the display device is connected to a timing control circuit (also referred to as a controller or a control IC) through a connection portion such as a flexible printed circuit (FPC).

In FIG. 12A, the first scan line driving circuit 602, the second scan line driving circuit 603, and the signal line driving circuit 604 are formed over the substrate 600 where the pixel portion 601 is formed. Accordingly, the number of components of a driving circuit which is provided outside and the like are reduced, so that a reduction in cost can be achieved. Further, if the driving circuit is provided outside the substrate 600, wirings would need to be extended and the number of connections of wirings would be increased. However, by providing the driving circuit over the substrate 600, the number of connections of the wirings can be reduced. Accordingly, the reliability or yield can be improved.

Figure 12B:
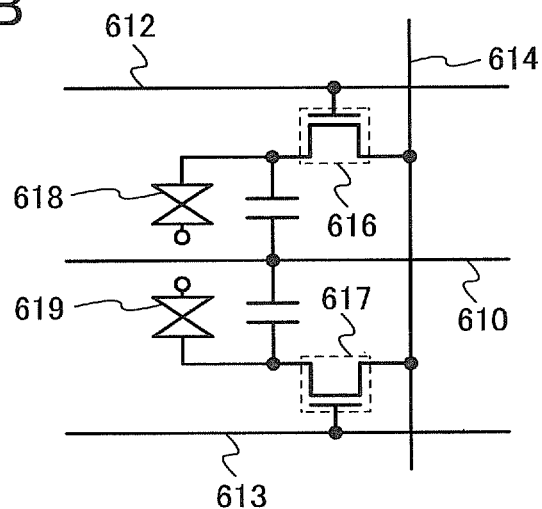

FIG. 12B illustrates an example of a circuit structure of the pixel portion. Here, a pixel structure of a VA liquid crystal display panel is shown.

In this pixel structure, a plurality of pixel electrodes are included in one pixel, and a transistor is connected to each of the pixel electrodes. The plurality of TFTs are constructed so as to be driven by different gate signals. That is, signals that are applied to individual pixel electrodes in a multi-domain pixel are controlled independently of each other.

A gate wiring 612 of a transistor 616 and a gate wiring 613 of a transistor 617 are separated so that different gate signals can be given thereto. In contrast, a source or drain electrode 614 serving as a data line is used in common for the transistors 616 and 617. As the transistors 616 and 617, the transistor described in any of the above embodiments can be used as appropriate. In the above manner, a highly reliable liquid crystal display panel can be provided.

A first pixel electrode electrically connected to the transistor 616 and a second pixel electrode electrically connected to the transistor 617 have different shapes and are separated by a slit. The second pixel electrode is provided so as to surround the external side of the first pixel electrode which is spread in a V shape. Timing of voltage application is made to vary between the first and second pixel electrodes by the transistors 616 and 617 in order to control alignment of the liquid crystal. The transistor 616 is connected to the gate wiring 612, and the transistor 617 is connected to the gate wiring 613. When different gate signals are supplied to the gate wiring 612 and the gate wiring 613, operation timings of the transistor 616 and the transistor 617 can be varied.

Further, a storage capacitor is formed using a capacitor wiring 610, a gate insulating film serving as a dielectric, and a capacitor electrode electrically connected to the first pixel electrode or the second pixel electrode.

The first pixel electrode, a liquid crystal layer, and a counter electrode overlap with each other to form a first liquid crystal element 618. The second pixel electrode, the liquid crystal layer, and the counter electrode overlap with each other to form a second liquid crystal element 619. The pixel structure is a multi-domain structure in which the first liquid crystal element 618 and the second liquid crystal element 619 are provided in one pixel.

Note that the pixel structure illustrated in FIG. 12B is not limited thereto. For example, a switch, a resistor, a capacitor, a transistor, a sensor, a logic circuit, or the like may be added to the pixel illustrated in FIG. 12B.

Figure 12C:
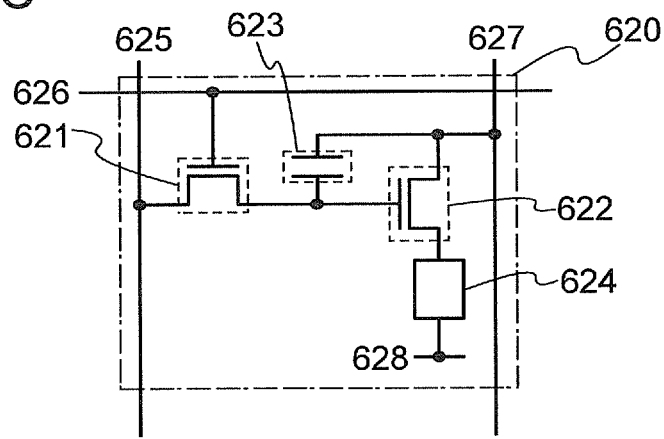

FIG. 12C shows an example of a circuit structure of the pixel portion. Here, a pixel structure of a display panel using an organic EL element is shown.

In an organic EL element, by application of a voltage to a light-emitting element, electrons and holes are separately injected from a pair of electrodes into a layer containing a light-emitting organic compound, so that current flows. Then, recombination of these carriers (the electrons and holes) makes the light-emitting organic compound to form an excited state and to emit light when it returns from the excited state to a ground state. Owing to such a mechanism, this light-emitting element is referred to as a current-excitation light-emitting element.

FIG. 12C illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 620 includes a switching transistor 621, a driving transistor 622, a light-emitting element 624, and a capacitor 623. A gate electrode of the switching transistor 621 is connected to a scan line 626. A first electrode (one of a source electrode and a drain electrode) of the switching transistor 621 is connected to a signal line 625. A second electrode (the other of the source electrode and the drain electrode) of the switching transistor 621 is connected to a gate electrode of the driving transistor 622. The gate electrode of the driving transistor 622 is connected to a power supply line 627 through the capacitor 623, a first electrode of the driving transistor 622 is connected to the power supply line 627, and a second electrode of the driving transistor 622 is connected to a first electrode (a pixel electrode) of the light-emitting element 624. A second electrode of the light-emitting element 624 corresponds to a common electrode 628. The common electrode 628 is electrically connected to a common potential line formed over the same substrate as the common electrode 628.

As the switching transistor 621 and the driving transistor 622, the transistor described in any of the above embodiments can be used as appropriate. In this manner, a highly reliable display panel including an organic EL element can be provided.

Note that the second electrode (the common electrode 628) of the light-emitting element 624 is set to have a low power supply potential. Note that a low power supply potential refers to a potential satisfying (the low power supply potential)<(a high power supply potential) based on the high power supply potential set for the power supply line 627. As the low power supply potential, GND, 0 V, or the like may be employed, for example. In order to apply a potential difference between the high power supply potential and the low power supply potential to the light-emitting element 624 and supply current to the light-emitting element 624 so that the light-emitting element 624 emits light, each potential is set so that the potential difference between the high power supply potential and the low power supply potential is higher than equal to forward threshold voltage of the light-emitting element 624.

Note that gate capacitance of the driving transistor 622 may be used as a substitute for the capacitor 623, so that the capacitor 623 can be omitted. The gate capacitance of the driving transistor 622 may be formed between the channel formation region and the gate electrode.

In the case of a voltage-input voltage driving method, a video signal is input to the gate electrode of the driving transistor 622 so that the driving transistor 622 is either substantially turned on or substantially turned off. That is, the driving transistor 622 operates in a linear region. Since the driving transistor 622 operates in a linear region, voltage higher than the voltage of the power supply line 627 is applied to the gate electrode of the driving transistor 622. A voltage higher than or equal to (power supply line voltage+ Vth of the driving transistor 622) is applied to the signal line 625.

In the case of performing analog grayscale driving instead of digital time grayscale driving, the same pixel structure as in FIG. 12C can be used by changing an input of a signal.

In the case of using the analog grayscale driving, voltage higher than or equal to (forward voltage of the light-emitting element 624+Vth of the driving transistor 622) is applied to the gate electrode of the driving transistor 622. The forward voltage of the light-emitting element 624 indicates a voltage at which a desired luminance is obtained, and includes at least a forward threshold voltage. The video signal by which the driving transistor 622 operates in a saturation region is input, so that current can be supplied to the light-emitting element 624. In order for the driving transistor 622 to operate in a saturation region, the potential of the power supply line 627 is set higher than the gate potential of the driving transistor 622. When an analog video signal is used, it is possible to feed current in accordance with the video signal to the light-emitting element 624 and perform analog grayscale driving.

Note that the pixel structure illustrated in FIG. 12C is not limited to the above. For example, a switch, a resistor, a capacitor, a sensor, a transistor, a logic circuit, or the like may be added to the pixel in FIG. 12C.

The structures, methods, and the like described in this embodiment can be combined with the structures, methods, and the like described in any of the other embodiments as appropriate.

(Embodiment 10)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in any of the above embodiments will be described.

Figure 13A:
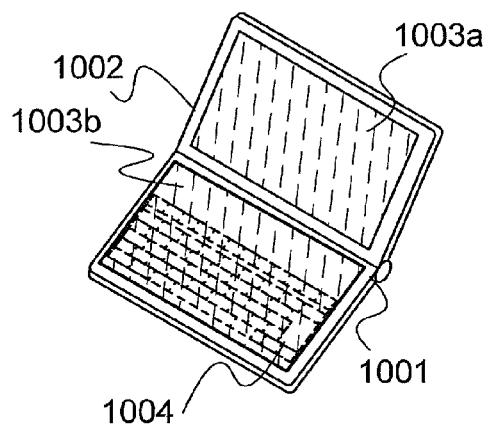
FIGS. 13A to 13D are external views each illustrating an electronic device according to an embodiment of the present invention.

FIG. 13A illustrates a portable information terminal, which includes a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is manufactured by using the transistor described in any of the above embodiments as a switching element and applied to the display portion 1003a or 1003b, whereby the reliability of the display portion of the portable information terminal can be improved.

The portable information terminal illustrated in FIG. 13A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 13A may transmit and receive data wirelessly. Through wireless communication, desired book data or the like can be purchased and downloaded from an electronic book server.

Figure 13B:
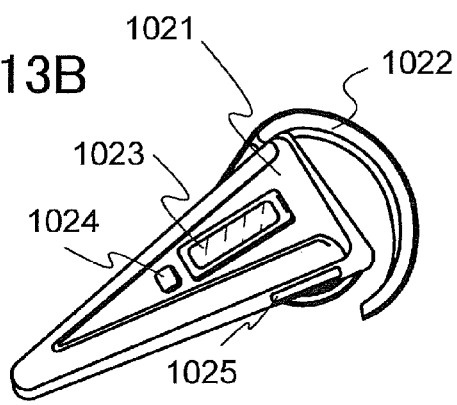

FIG. 13B illustrates a portable music player, which includes, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is manufactured by using the transistor described in any of the above embodiments as a switching element and applied to the display portion 1023, whereby the reliability of the display portion of the portable music player can be improved.

Furthermore, when the portable music player illustrated in FIG. 13B has an antenna, a microphone function, or a wireless communication function and is used with a mobile phone, a user can talk on the phone wirelessly in a hands-free way while driving a car or the like.

Figure 13C:
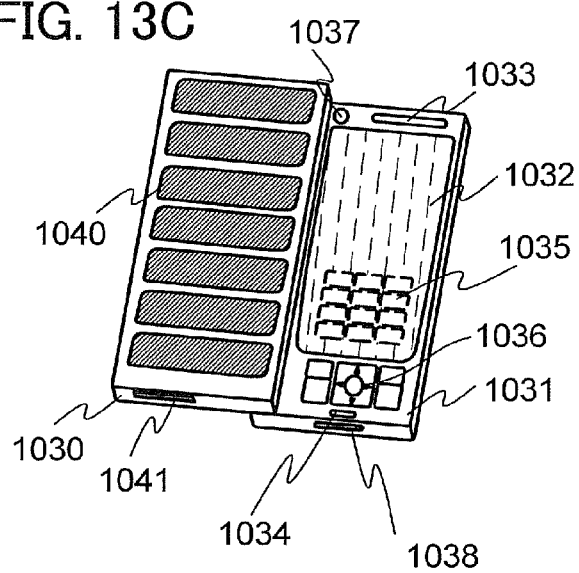

FIG. 13C illustrates a mobile phone which includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. The transistor described in any of the above embodiments is applied to the display panel 1032, whereby the reliability of the display portion of the mobile phone can be improved.

Further, the display panel 1032 includes a touch panel. A plurality of operation keys 1035 which are displayed as images are indicated by dotted lines in FIG. 13C. Note that a boosting circuit by which a voltage output from the solar cell 1040 is increased to be sufficiently high for each circuit is also included.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are developed as illustrated in FIG. 13C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 13D:
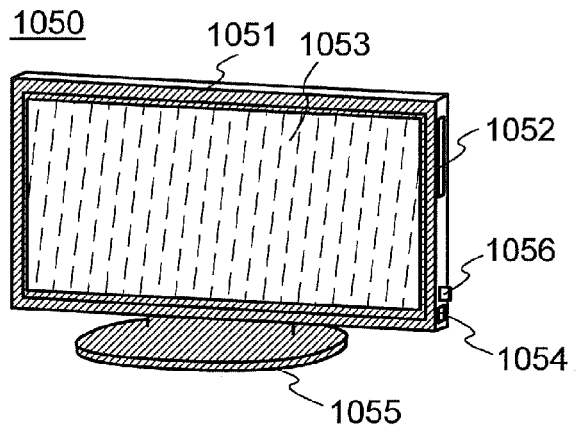

FIG. 13D illustrates an example of a television set. In a television set 1050, a display portion 1053 is incorporated in a housing 1051. Images can be displayed on the display portion 1053. Here, the housing 1051 is supported on a stand 1055 incorporating a CPU. When the transistor described in any of the above embodiments is applied to the display portion 1053, the reliability of the display portion 1053 of the television set 1050 can be improved.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) data communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

When the memory device described in any of the above embodiments is applied to the external memory 1056 or a CPU, the television set 1050 can have high reliability and power consumption thereof can be sufficiently reduced.

The structures, methods, and the like described in this embodiment can be combined with the structures, methods, and the like described in any of the other embodiments as appropriate.

This application is based on Japanese Patent Application serial no. 2011-086456 filed with Japan Patent Office on Apr. 8, 2011, the entire contents of which are hereby incorporated by reference.

What is claimed is:

1. A semiconductor device comprising:
    a first insulating film comprising silicon and oxygen;
    an oxide semiconductor film on the first insulating film, the oxide semiconductor film including a first part comprising a channel formation region and second parts with the first part positioned therebetween;
    a gate insulating film over the oxide semiconductor film;
    a gate electrode over the gate insulating film, the gate electrode overlapping with the channel formation region;
    a source electrode and a drain electrode on and in contact with the second parts of the oxide semiconductor film;
    a second insulating film comprising silicon and oxygen and covering the gate electrode, the source electrode, and the drain electrode, the second insulating film extending beyond a periphery of the oxide semiconductor film; and
    a third insulating film comprising aluminum oxide on the second insulating film, the third insulating film overlapping with the oxide semiconductor film and extending beyond the periphery of the oxide semiconductor film,
    wherein the first insulating film comprises:
    a first region comprising a first oxide insulating material; and
    a second region comprising a second oxide insulating material, the second region surrounding the first region.

2. The semiconductor device according to claim 1, wherein an amount of released oxygen from the first insulating film in thermal desorption spectroscopy analysis is greater than or equal to $1.0 \times 10^{18}$ atoms/cm$^3$.

3. The semiconductor device according to claim 1, wherein an amount of released oxygen from the first insulating film in thermal desorption spectroscopy analysis is greater than or equal to $3.0 \times 10^{20}$ atoms/cm$^3$.

4. The semiconductor device according to claim 1,
    wherein the first oxide insulating material comprises silicon and oxygen, and
    wherein the second oxide insulating material comprises aluminum oxide.

5. The semiconductor device according to claim 1, wherein each edge of the oxide semiconductor film extends over boundaries between the first region and the second region.

6. The semiconductor device according to claim 1, wherein each edge of the oxide semiconductor film is located over the second region of the first insulating film.

7. The semiconductor device according to claim 1, wherein the oxide semiconductor film comprises In, Ga, and Zn.

8. The semiconductor device according to claim 1, wherein the second insulating film comprises one of silicon oxide, silicon oxynitride, and silicon nitride oxide.

9. The semiconductor device according to claim 1, wherein an amount of released oxygen from the second insulating film in thermal desorption spectroscopy analysis is greater than or equal to $1.0 \times 10^{18}$ atoms/cm$^3$.

10. The semiconductor device according to claim 1, wherein an amount of released oxygen from the second insulating film in thermal desorption spectroscopy analysis is greater than or equal to $3.0 \times 10^{20}$ atoms/cm$^3$.

11. The semiconductor device according to claim 1, wherein the second insulating film is thicker than the third insulating film.

12. A semiconductor device comprising:
    a first insulating film comprising silicon and oxygen;
    a transistor comprising:
        an oxide semiconductor film on the first insulating film, the oxide semiconductor film including a first part comprising a channel formation region and second parts with the first part positioned therebetween; and
        a source electrode and a drain electrode on and in contact with the second parts of the oxide semiconductor film;
    a second insulating film comprising silicon and oxygen covering the source electrode and the drain electrode, the second insulating film extending beyond a periphery of the oxide semiconductor film; and
    a third insulating film comprising aluminum oxide on the second insulating film, the third insulating film overlapping with the oxide semiconductor film and extending beyond the periphery of the oxide semiconductor film, wherein the first insulating film comprises:

a first region comprising a first oxide insulating material; and a second region comprising a second oxide insulating material, the second region surrounding the first region.

13. The semiconductor device according to claim 12, wherein an amount of released oxygen from the first insulating film in thermal desorption spectroscopy analysis is greater than or equal to $1.0 \times 10^{18}$ atoms/cm$^3$.

14. The semiconductor device according to claim 12, wherein an amount of released oxygen from the first insulating film in thermal desorption spectroscopy analysis is greater than or equal to $3.0 \times 10^{20}$ atoms/cm$^3$.

15. The semiconductor device according to claim 12,
wherein the first oxide insulating material comprises silicon and oxygen, and
wherein the second oxide insulating material comprises aluminum oxide.

16. The semiconductor device according to claim 12, wherein each edge of the oxide semiconductor film extends over boundaries between the first region and the second region.

17. The semiconductor device according to claim 12, wherein each edge of the oxide semiconductor film is located over the second region of the first insulating film.

18. The semiconductor device according to claim 12, wherein the oxide semiconductor film comprises In, Ga, and Zn.

19. The semiconductor device according to claim 12, wherein the second insulating film comprises one of silicon oxide, silicon oxynitride, and silicon nitride oxide.

20. The semiconductor device according to claim 12, wherein an amount of released oxygen from the second insulating film in thermal desorption spectroscopy analysis is greater than or equal to $1.0 \times 10^{18}$ atoms/cm$^3$.

21. The semiconductor device according to claim 12, wherein an amount of released oxygen from the second insulating film in thermal desorption spectroscopy analysis is greater than or equal to $3.0 \times 10^{20}$ atoms/cm$^3$.

22. The semiconductor device according to claim 12, wherein the second insulating film is thicker than the third insulating film.

23. A semiconductor device comprising:

a first insulating film comprising silicon and oxygen;

a transistor comprising an oxide semiconductor film on the first insulating film, the oxide semiconductor film comprising a channel formation region;

a second insulating film comprising silicon and oxygen on the transistor, the second insulating film extending beyond a periphery of the oxide semiconductor film; and a third insulating film comprising aluminum oxide on the second insulating film, the third insulating film overlapping with the oxide semiconductor film and extending beyond the periphery of the oxide semiconductor film, wherein the first insulating film comprises:

a first region comprising a first oxide insulating material; and a second region comprising a second oxide insulating material, the second region surrounding the first region.

24. The semiconductor device according to claim 23,
wherein the first oxide insulating material comprises silicon and oxygen, and
wherein the second oxide insulating material comprises aluminum oxide.

25. The semiconductor device according to claim 23, wherein an amount of released oxygen from the first insulating film in thermal desorption spectroscopy analysis is greater than or equal to $1.0 \times 10^{18}$ atoms/cm$^3$.

26. The semiconductor device according to claim 23, wherein an amount of released oxygen from the first insulating film in thermal desorption spectroscopy analysis is greater than or equal to $3.0 \times 10^{20}$ atoms/cm$^3$.

27. The semiconductor device according to claim 23, wherein each edge of the oxide semiconductor film extends over boundaries between the first region and the second region.

28. The semiconductor device according to claim 23, wherein each edge of the oxide semiconductor film is located over the second region of the first insulating film.

29. The semiconductor device according to claim 23, wherein the oxide semiconductor film comprises In, Ga, and Zn.

30. The semiconductor device according to claim 23, wherein the second insulating film comprises one of silicon oxide, silicon oxynitride, and silicon nitride oxide.

31. The semiconductor device according to claim 23, wherein an amount of released oxygen from the second insulating film in thermal desorption spectroscopy analysis is greater than or equal to $1.0 \times 10^{18}$ atoms/cm$^3$.

32. The semiconductor device according to claim 23, wherein an amount of released oxygen from the second insulating film in thermal desorption spectroscopy analysis is greater than or equal to $3.0 \times 10^{20}$ atoms/cm$^3$.

33. The semiconductor device according to claim 23, wherein the second insulating film is thicker than the third insulating film.

* * * * *